(12) United States Patent
Baba et al.

(10) Patent No.: US 8,471,371 B2
(45) Date of Patent: Jun. 25, 2013

(54) SEMICONDUCTOR WIRING ASSEMBLY, SEMICONDUCTOR COMPOSITE WIRING ASSEMBLY, AND RESIN-SEALED SEMICONDUCTOR DEVICE

(75) Inventors: Susumu Baba, Kawagoe (JP); Masachika Masuda, Tokorozawa (JP); Hiromichi Suzuki, Machida (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 674 days.

(21) Appl. No.: 12/701,053

(22) Filed: Feb. 5, 2010

(65) Prior Publication Data
US 2011/0006410 A1 Jan. 13, 2011

(30) Foreign Application Priority Data
Jul. 13, 2009 (JP) ................................. 2009-164910

(51) Int. Cl.
*H01L 23/495* (2006.01)
(52) U.S. Cl.
USPC ........... 257/668; 257/666; 257/670; 257/672; 257/E23.031; 257/E21.051
(58) Field of Classification Search
USPC ... 257/678–733, 787–796, E23.001–E23.194
See application file for complete search history.

(56) References Cited

U.S. PATENT DOCUMENTS

| 5,293,066 A | * | 3/1994 | Tsumura ........................ 257/668 |
| 5,889,325 A | | 3/1999 | Uchida et al. |
| 6,071,755 A | * | 6/2000 | Baba et al. .................... 438/106 |
| 2008/0241505 A1 | * | 10/2008 | Kobori et al. .............. 428/317.1 |

FOREIGN PATENT DOCUMENTS

| JP | 03-136269 | 6/1991 |
| JP | 10-041434 | 2/1998 |

* cited by examiner

*Primary Examiner* — Mamadou Diallo
(74) *Attorney, Agent, or Firm* — Burr & Brown

(57) ABSTRACT

A semiconductor composite wiring assembly includes a wiring assembly and a lead frame. A copper wiring layer of the wiring assembly includes first terminals, second terminals, and wiring sections connecting the terminals. The second terminals and the lead frame are electrically connected by connecting members. The lead frame includes a die pad for mounting the wiring assembly, and lead sections located at outer positions. The die pad includes a central area in which a semiconductor chip is mounted via the wiring assembly, and a peripheral area connected to the central area with spaces formed therebetween that serve as resin-seal inflow spaces. The wiring assembly is positioned over the central area and the peripheral area so as to cover the central area completely and the peripheral area partially, and at least the central area and the peripheral area of the die pad are glued to the wiring assembly by resin paste.

8 Claims, 24 Drawing Sheets

SEMICONDUCTOR WIRING ASSEMBLY, SEMICONDUCTOR COMPOSITE WIRING ASSEMBLY, AND RESIN-SEALED SEMICONDUCTOR DEVICE

CROSS-REFERENCE TO RELATED APPLICATION

This application claims the benefit of Japanese Patent Application No. 2009-164910, filed on Jul. 13, 2009, the content of which is incorporated herein by reference.

BACKGROUND OF THE INVENTION

1. Field of the Invention

The present invention relates to a semiconductor wiring assembly, a semiconductor composite wiring assembly, and a resin-sealed semiconductor device. The invention relates particularly to a semiconductor wiring assembly, a semiconductor composite wiring assembly, and a resin-sealed semiconductor device that allow for reliable mounting of a smaller semiconductor chip (larger-scale integration chip) than conventional ones and contribute to manufacturing cost reduction.

2. Description of the Related Art

Recent progress in large-scale integration and miniaturization technologies, coupled with the current trend toward highly-functionalized, small electronic devices, has led to even larger-scale integration and further functionalization of semiconductor devices. The number of terminals (pins) used in such semiconductor devices is thus being required to be increased.

An example of such a semiconductor device is a semiconductor package which is formed by mounting a semiconductor chip such as an IC chip and a LSI chip on a lead frame and sealing them with insulating resin. With the progress in large-scale integration and miniaturization, such a package structure has shifted toward thinner and smaller structures, that is, from SOJ (Small Outline J-leaded) packages and QF (Quad Flat) packages, in which external leads protrude from the side walls of a resin package, toward QFN (Quad Flat Non-leaded) packages and SON (Small Outline Non-leaded) packages, in which external leads are embedded on the bottom surface of a resin package without protruding from its side walls.

Another currently used package type is BGA (Ball Grid Array) packages (surface-mount packages), which were designed to overcome problems associated with QF-package mounting. In a BGA package, solder balls are used as the outer terminals of the package. LGA (Land Grid Array) packages are also in use today. In a LGA package, which is also a surface-mount package, flat electrodes arranged in the form of a matrix are used as the outer terminals of the package in place of solder balls.

Conventional semiconductor devices are disclosed, for example, in Japanese Patent No. 2688099 and JP-A-10-41434.

SUMMARY OF THE INVENTION

While semiconductor chips are being further reduced in size, further difficulties may be involved in mounting such a small semiconductor chip on a lead frame because the pitch of the inner leads of the lead frame cannot be reduced unlimitedly.

Further, when such a small semiconductor chip is to be inspected for defects, such an inspection has to be conducted after the chip is packaged into a semiconductor device. Thus, if the chip is defective, the semiconductor device itself has to be discarded. This may result in a decrease in the yield of semiconductor chips and is disadvantageous in terms of costs.

In view of the above problems, an object of the invention is thus to provide a semiconductor wiring assembly, a semiconductor composite wiring assembly, and a resin-sealed semiconductor device that allow for reliable mounting of a smaller semiconductor chip (larger-scale integration chip) than conventional ones and inspection of a semiconductor chip before packaging the chip and contribute to manufacturing cost reduction.

In one aspect, the invention is a semiconductor composite wiring assembly for electrically connecting electrodes of a semiconductor chip to a wiring board, the semiconductor composite wiring assembly comprising: a wiring assembly; and a lead frame electrically connected to the wiring assembly with the wiring assembly mounted thereon, wherein the wiring assembly includes: an insulating layer; a metal substrate formed on one surface of the insulating layer; and a copper wiring layer formed on the opposite surface of the insulating layer, the copper wiring layer having thereon a chip placement section, the copper wiring layer further having: first terminals each being to be connected electrically to one of the electrodes of the semiconductor chip; second terminals each connected electrically to the lead frame by a second connecting member; and wiring sections each adapted to connect one of the first terminals and one of the second terminals, wherein the lead frame includes: a die pad for mounting thereon the wiring assembly, the die pad having: a central area in which the semiconductor chip is mounted via the wiring assembly; and a peripheral area connected to and located around the central area with spaces formed therebetween, the spaces serving as spaces into which a resin seal flows; and lead sections located at outer positions with respect to the die pad, wherein the wiring assembly is positioned over the central area and the peripheral area so as to cover the central area completely and the peripheral area at least partially, and wherein at least the central area and the peripheral area of the die pad are glued to the wiring assembly by resin paste.

In the above semiconductor composite wiring assembly, the metal substrate is preferably made of stainless steel.

In the above semiconductor composite wiring assembly, the resin paste is preferably applied onto the central area and the peripheral area in the form of dots or lines.

In the above semiconductor composite wiring assembly, at least the central area and the peripheral area of the die pad are plated.

In another aspect, the invention is a resin-sealed semiconductor device comprising: a wiring assembly; a lead frame electrically connected to the wiring assembly with the wiring assembly mounted thereon; and a semiconductor chip having electrodes, wherein the wiring assembly includes: an insulating layer; a metal substrate formed on one surface of the insulating layer; and a copper wiring layer formed on the opposite surface of the insulating layer, the copper wiring layer having thereon a chip placement section, the copper wiring layer further having: first terminals each connected electrically to one of the electrodes of the semiconductor chip by a first connecting member; second terminals each connected electrically to the lead frame by a second connecting member; and wiring sections each adapted to connect one of the first terminals and one of the second terminals, wherein the lead frame includes: a die pad for mounting thereon the wiring assembly, the die pad having: a central area in which the semiconductor chip is mounted via the wiring assembly; and a peripheral area connected to and located around the central area with spaces formed therebetween, the spaces serving as spaces into which a resin seal flows; and lead sections located at outer positions with respect to the die pad, wherein the semiconductor chip is mounted on the chip placement section, wherein the wiring assembly is positioned over the central area and the peripheral area so as to cover the central area completely and the peripheral area at least partially, wherein at least the central area and the peripheral area of the die pad are glued to the wiring assembly by resin paste, and wherein the semiconductor chip, the copper wiring layer, the lead frame, the first connecting members, and the second connecting members are all sealed with a resin seal with the lead frame exposed partially.

In the above semiconductor device, the metal substrate is preferably made of stainless steel.

In the above semiconductor device, the resin paste is preferably applied onto the central area and the peripheral area in the form of dots or lines.

In the above semiconductor device, at least the central area and the peripheral area of the die pad are plated.

In accordance with the invention, the inner leads of the lead frame, the pitch of which is relatively large, can be reliably connected to the electrodes of the semiconductor chip, the pitch of which is relatively small, because the first connecting members are used to electrically connect the semiconductor chip to the copper wiring layer and the second connecting members are used to electrically connect the copper wiring layer to the lead frame. Thus, the semiconductor chip, smaller than conventional ones, can be mounted on the lead frame of the semiconductor device.

The invention also allows the semiconductor chip, before integrated into the semiconductor device, to be inspected even when the chip is mounted on the semiconductor wiring assembly or semiconductor composite wiring assembly.

Since the copper wiring layer is present between the first connecting members and the second connecting members, the invention also allows reduction in the manufacturing cost of the semiconductor device, which would be lower than when gold bonding wires are used to directly connect the semiconductor chip and the lead frame.

Further, since the metal substrate of the invention is made of stainless steel, it is more rigid and thinner and can be handled more easily than conventional polyimide substrates. The use of stainless steel is also advantageous in that the heat of the semiconductor chip can be released from the bottom surface of the metal substrate.

The copper wiring layer of the invention can also include terminal blocks each electrically connected to some of the electrodes (e.g., power supply terminals) of the semiconductor chip. Thus, the number of the second connecting members can be reduced, and so can the number of terminals used in the semiconductor device.

The semiconductor device of the invention is also less costly because the outer dimensions of the semiconductor device are small and a great number of such devices can be fabricated on a single board.

The semiconductor wiring assembly of the invention can instead be mounted on two die pads which are collectively slightly larger in surface area than the semiconductor wiring assembly. By connecting the die pads and the semiconductor wiring assembly, the die pads can be used as ground blocks.

Further, it is also possible to mount the semiconductor chip on the copper wiring layer via an insulating film or paste, make the die pad larger than the semiconductor chip, make the die pad serve as a ground layer, and connect the die pad and the semiconductor chip with wires. In that case, too, the number of terminals to be used in the semiconductor device can be reduced.

DETAILED DESCRIPTIOIN OF THE INVENTION

Embodiments of the present invention will now be described with reference to the accompanying drawings.
Embodiment 1

FIGS. 1 through 11, 14, and 15 illustrate Embodiment 1 of the invention.

Figure 1:
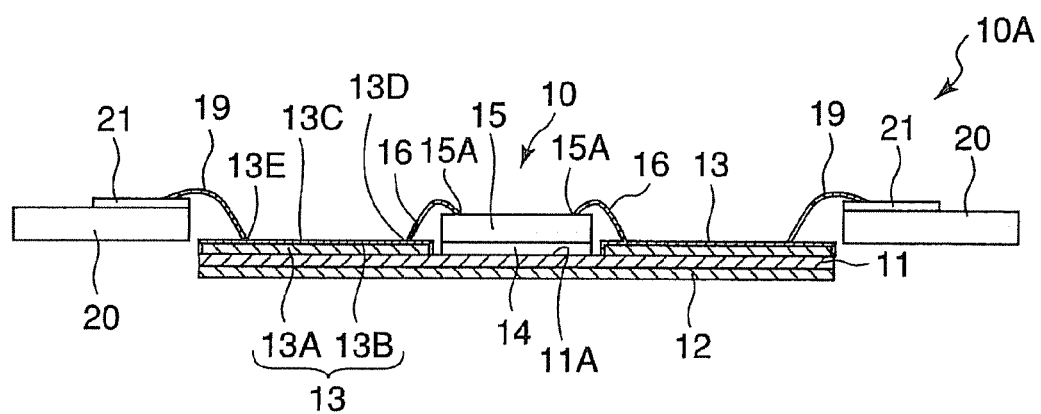
FIG. 1 is a cross-sectional view of a semiconductor wiring assembly (wired type) according to Embodiment 1 of the invention.
Figure 2:
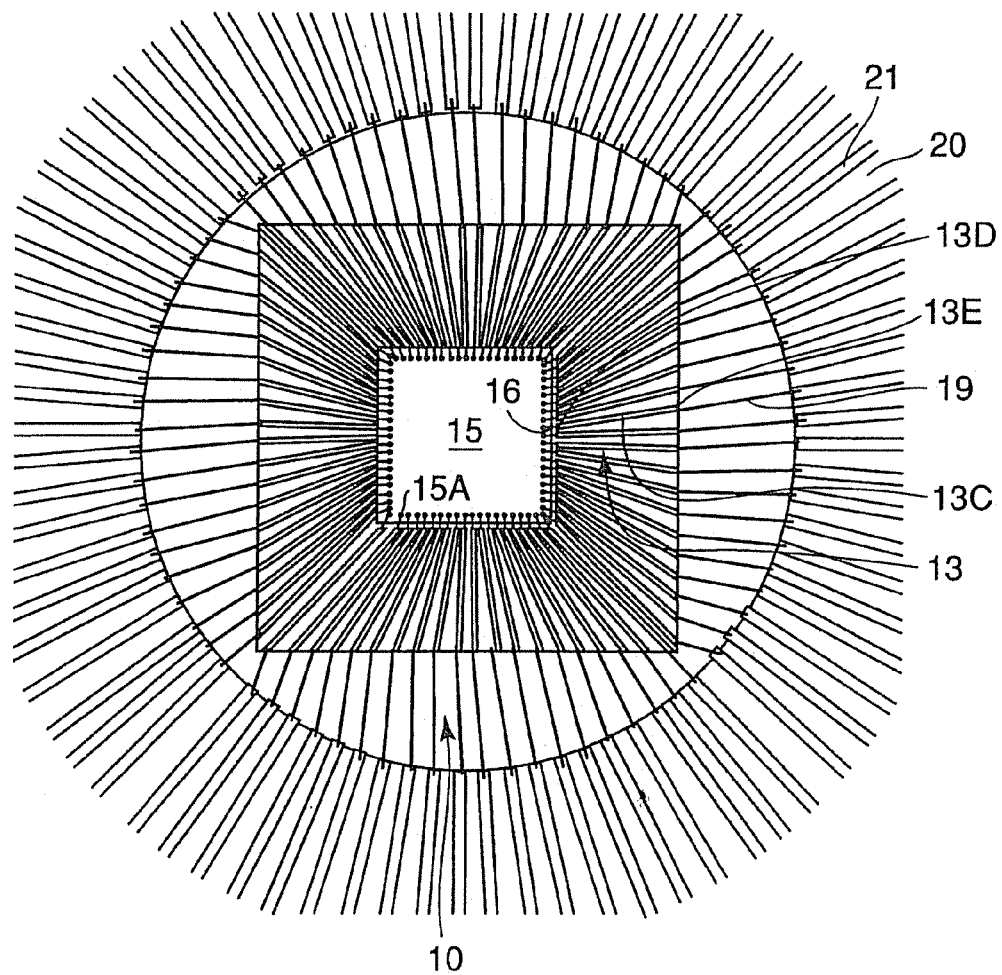
FIG. 2 is a plan view of the wiring assembly of FIG. 1.
Figure 3:
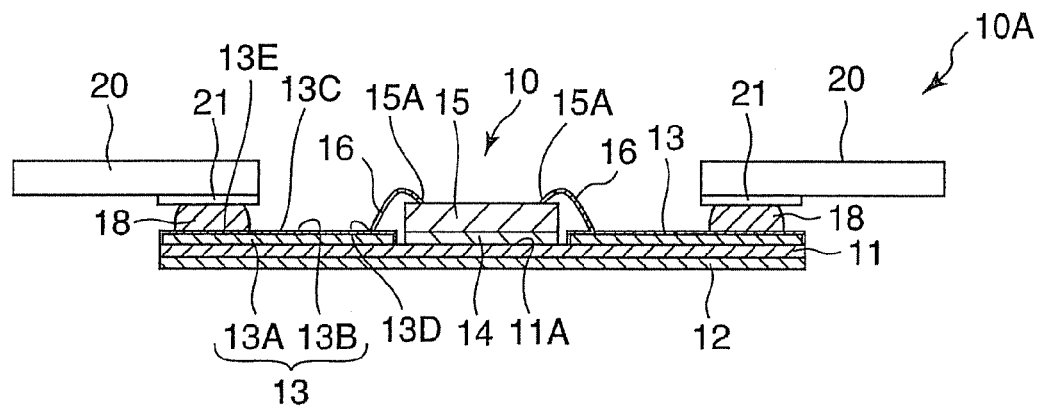
FIG. 3 is a cross-sectional view illustrating Modification 1 (soldered type) of the wiring assembly of FIG. 1.

With reference first to FIGS. 1 through 3, a semiconductor wiring assembly according to Embodiment 1 is described.

As illustrated in FIG. 1, the semiconductor wiring assembly of Embodiment 1, indicated by reference numeral 10, is used to wire electrodes 15A (described later) of a semiconductor chip 15 to external wiring such as inner leads 21 (described later) of a lead frame 20 and the like so that electricity is conducted therebetween.

The semiconductor wiring assembly 10 includes an insulating layer 11 made of polyimide or the like; a metal substrate 12 placed on one surface of the insulating layer 11; and a copper wiring layer 13 placed on the opposite surface of the insulating layer 11. The copper wiring layer 13 includes first terminals 13D that are each connected electrically to one of the electrodes 15A of the semiconductor chip 15; second terminals 13E that are each connected electrically to one of the inner leads 21 of the lead frame 20; and wiring sections 13C that each electrically connect one of the first terminals 13D and one of the second terminals 13E.

A second connecting member 19 is connected to each of the second terminals 13E of the copper wiring layer 13. Specifically, one end of the second connecting member 19 is connected to one of the second terminals 13E, and the other end thereof is connected to one of the inner leads 21 (described later) of the lead frame 20. In FIGS. 1 and 2, each of the second connecting members 19 is a gold bonding wire.

As illustrated in the plan view of FIG. 2, the wiring sections 13C of the copper wiring layer 13 extend in a radial manner from the semiconductor chip 15. The copper wiring layer 13 is formed of a base copper layer 13A and a plated layer 13B that covers the copper layer 13A, as illustrated in the cross-section of FIG. 1. The plated layer 13B is made, for example, of a nickel-plated (Ni) layer and a gold-plated (Au) layer placed thereon.

The most suitable material for the metal substrate 12 is stainless steel although other types of metal can also be used. The use of stainless steel increases the rigidity of the metal substrate 12 and reduces its thickness and is advantageous in that the heat of the semiconductor chip 15 can be released from the bottom surface of the metal substrate 12.

A chip placement section 11A is also formed on the surface of the insulating layer 11 on which the copper wiring layer 13 is formed. The electrodes 15A on the semiconductor chip 15 are arranged along the periphery of the chip placement section 11A, as illustrated in FIG. 2. The semiconductor chip 15 is glued onto the chip placement section 11A via an adhesive layer 14. The electrodes 15A of the semiconductor chip 15 and the first terminals 13D of the copper wiring layer 13 are electrically connected by first connecting members 16, each of which is a gold (Au) bonding wire.

Described next with reference to FIG. 3 is another configuration of the semiconductor wiring assembly 10 (Modification 1). In FIG. 3, the same components as used in the semiconductor wiring assembly 10 of FIGS. 1 and 2 are assigned the same reference numerals and will not be discussed further in detail.

As illustrated in FIG. 3, the semiconductor wiring assembly 10, which is to be soldered to the lead frame 20, also includes the insulating layer 11, the metal substrate 12 placed on one surface of the insulating layer 11, and the copper wiring layer 13 placed on the opposite surface of the insulating layer 11.

The chip placement section 11A is formed on the surface of the insulating layer 11 on which the copper wiring layer 13 is formed. The semiconductor chip 15 is glued onto the chip placement section 11A via the adhesive layer 14. The semiconductor chip 15 and the first terminals 13D of the copper wiring layer 13 are electrically connected by the first connecting members 16, each of which is a gold (Au) bonding wire.

As illustrated in FIG. 3, a second connecting member 18 is placed on each of the second terminals 13E of the copper wiring layer 13. The lower end of the second connecting member 18 is connected to one of the second terminals 13E, and the upper end thereof is connected to one of the inner leads 21 (described later) of the lead frame 20. In FIG. 3, each of the second connecting members 18 is a solder ball.

In FIGS. 1 through 3, the semiconductor wiring assembly 10, the lead frame 20, and the second connecting members 18 (or 19) constitute a semiconductor composite wiring assembly 10A. The lead frame 20 is electrically connected with the wiring assembly 10, and the second connection members 18 (or 19) electrically connect the second terminals 13E of the copper wiring layer 13 with the lead frame 20. The semiconductor composite wiring assembly 10A is used to electrically connect the electrodes 15A of the semiconductor chip 15 to an external wiring board (not illustrated).

FIGS. 1 and 3 illustrate examples in which bonding wires are used as the first connecting members 16, which electrically connect the electrodes 15A of the semiconductor chip 15 to the first terminals 13D of the copper wiring layer 13. However, the first connecting members 16 can instead be gold bumps or solder balls. In that case, the semiconductor chip 15 is fixed such that its electrodes 15A directly face the first terminals 13D of the wiring assembly 10. The use of gold bumps or solder balls as the first connecting members 16 is also applicable to Embodiment 2 of the invention (described later) which is designed as a BGA package.

Figure 4:
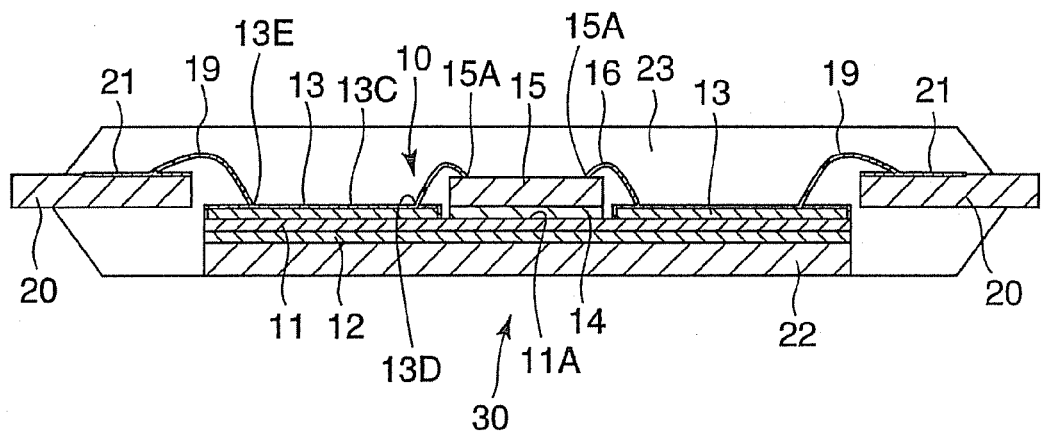
FIG. 4 is a cross-sectional view of a semiconductor device having the wiring assembly of FIG. 1.
Figure 5:
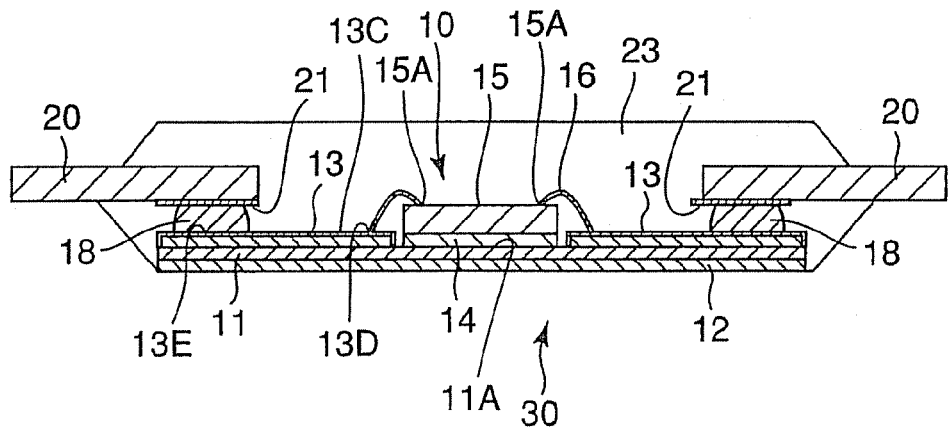
FIG. 5 is a cross-sectional view of a semiconductor device having the wiring assembly of FIG. 3.

Described next with reference to FIGS. 4 and 5 are two semiconductor devices, one of which has the semiconductor wiring assembly 10 of FIG. 1 and the other of which has the semiconductor wiring assembly 10 of FIG. 3.

The semiconductor device 30 of FIG. 4 includes the semiconductor wiring assembly 10 of FIG. 1. Specifically, the semiconductor device 30 includes the lead frame 20 having a die pad 22; the semiconductor wiring assembly 10 placed on the die pad 22 and electrically connected to the lead frame 20; and the semiconductor chip 15 having the electrodes 15A, which is placed on the chip placement section 11A of the semiconductor wiring assembly 10.

The inner leads 21 are formed on the top surface of the lead frame 20, and the second connecting members 19 (i.e., bonding wires) each electrically connect one of the second terminals 13E of the copper wiring layer 13 to one of the inner leads 21. Each of the first connecting members 16 electrically connects one of the electrodes 15A of the semiconductor chip 15 to one of the first terminals 13D. The semiconductor chip 15, the copper wiring layer 13, the lead frame 20, the first connecting members 16, and the second connecting members 19 are all sealed by a resin seal 23 with the lead frame 20 partially exposed.

The semiconductor device 30 of FIG. 5 includes the semiconductor wiring assembly 10 of FIG. 3. Specifically, the semiconductor device 30 includes the lead frame 20; the semiconductor wiring assembly 10 placed in the center of the lead frame 20 and electrically connected to the lead frame 20; and the semiconductor chip 15 having the electrodes 15A, which is placed on the chip placement section 11A of the semiconductor wiring assembly 10.

The inner leads 21 are formed on the bottom surface of the lead frame 20, and the second connecting members 18 (i.e., solder balls) each electrically connect one of the second terminals 13E of the copper wiring layer 13 to one of the inner leads 21. Each of the first connecting members 16 electrically connects one of the electrodes 15A of the semiconductor chip 15 to one of the first terminals 13D. The semiconductor chip 15, the copper wiring layer 13, the lead frame 20, the first connecting members 16, and the second connecting members 18 are all sealed by the resin seal 23 with part of the lead frame 20 (i.e., outer leads) exposed.

While FIGS. 4 and 5 illustrate examples in which the semiconductor wiring assemblies of FIGS. 1 and 3 are each mounted on the lead frame 20, a thinner semiconductor device can be manufactured by instead integrating the semiconductor wiring assembly of FIG. 1 or 3 or the semiconductor device of FIG. 12 (described later) into a built-up circuit board.

In each of FIGS. 4 and 5, the bottom surface of the semiconductor composite wiring assembly 10A is exposed, not sealed with the resin seal 23. However, the bottom surface can also be sealed with the resin seal 23 if designed so or if there is no need to increase the heat release capabilities of the semiconductor device 30.

Next, effects of the aforementioned configurations according to the present embodiment are described below.

With reference now to FIGS. 6(a) to 6(d), a possible method is described for manufacturing the semiconductor wiring assembly 10 of FIG. 1.

First, the metal substrate 12 (preferably stainless steel) is provided (FIG. 6(a)). The insulating layer 11 made of polyimide is then deposited on the metal substrate 12 (FIG. 6(b)).

Next, the copper layer 13A is formed on the insulating layer 11 by an additive method or etching (FIG. 6(c)). Thereafter, the plated layer 13B made, for example, of a nickel-plated (Ni) layer and a gold-plated (Au) layer is formed on the copper layer 13A by electrolytic plating or non-electrolytic plating, thereby completing the copper wiring layer 13 having the copper layer 13A and the plated layer 13B (FIG. 6(d)). During the step of FIG. 6(d), the first terminals 13D, the second terminals 13E, and the wiring sections 13C are also formed. The above method results in the semiconductor wiring assembly 10 having the insulating layer 11, the metal substrate 12, and the copper wiring layer 13.

With reference now to FIGS. 7(a) to 7(f), a possible method is described for manufacturing the semiconductor device of FIG. 4 that includes the semiconductor wiring assembly 10 of FIG. 1, which assembly is of a wired type (i.e., has the second connecting members 19 or bonding wires).

First, the above-described steps of FIGS. 6(a) to 6(d) are followed to manufacture the semiconductor wiring assembly 10 (FIG. 7(a)). The semiconductor chip 15 is then glued to the chip placement section 11A of the semiconductor wiring assembly 10 via the adhesive layer 14 (FIG. 7(b)). Next, the first connecting members 16 (i.e., bonding wires) are used to connect the electrodes 15A of the semiconductor chip 15 to the first terminals 13D of the copper wiring layer 13 (FIG. 7(c)).

The lead frame 20 having the inner leads 21 and the die pad 22 is then provided, and the semiconductor wiring assembly 10 is placed on the die pad 22 (FIG. 7(d)).

Next, the second connecting members 19 (i.e., bonding wires) are used to connect the second terminals 13E of the copper wiring layer 13 to the inner leads 21 of the lead frame 20 (FIG. 7(e)). Thereafter, the semiconductor wiring assembly 10, the semiconductor chip 15, the first connecting members 16, the die pad 22, the second connecting members 19, and the inner leads 21 are all sealed by the resin seal 23 with part of the lead frame 20 (i.e., outer leads) exposed, thereby completing the semiconductor device 30 of FIG. 4 (FIG. 7(f)).

Described next with reference to FIGS. 14(a) to 14(f) is a modification of the above-described method for manufacturing the semiconductor device of FIG. 4.

First, the above-described steps of FIGS. 6(a) to 6(d) are followed to manufacture the semiconductor wiring assembly 10 (FIG. 14(a)). Next, the lead frame 20 having the inner leads 21 and the die pad 22 is provided, and the semiconductor wiring assembly 10 is placed on the die pad 22 (FIG. 14(b)).

The semiconductor chip 15 is then glued to the chip placement section 11A of the semiconductor wiring assembly 10 via the adhesive layer 14 (FIG. 14(c)). Next, the first connecting members 16 (i.e., bonding wires) are used to connect the electrodes 15A of the semiconductor chip 15 to the first terminals 13D of the copper wiring layer 13 (FIG. 14(d)).

Next, the second connecting members 19 (i.e., bonding wires) are used to connect the second terminals 13E of the copper wiring layer 13 to the inner leads 21 of the lead frame 20 (FIG. 14(e)). Thereafter, the semiconductor wiring assembly 10, the semiconductor chip 15, the first connecting members 16, the die pad 22, the second connecting members 19, and the inner leads 21 are all sealed by the resin seal 23 with part of the lead frame 20 (i.e., outer leads) exposed, thereby completing the semiconductor device 30 of FIG. 4 (FIG. 14(f)).

With reference to FIGS. 8(a) to 8(f), a method is described for manufacturing the semiconductor device of FIG. 5 that includes the semiconductor wiring assembly 10 of FIG. 3, which assembly is of a soldered type (i.e., has the second connecting members 18 or solder balls).

First, the above-described steps of FIGS. 6(a) to 6(d) are followed to manufacture the semiconductor wiring assembly 10 (FIG. 8(a)). The semiconductor chip 15 is then glued to the chip placement section 11A of the semiconductor wiring assembly 10 via the adhesive layer 14 (FIG. 8(b)). Next, the first connecting members 16 (i.e., bonding wires) are used to connect the electrodes 15A of the semiconductor chip 15 to the first terminals 13D of the copper wiring layer 13 (FIG. 8(c)).

Next, the second connecting members 18 (i.e., solder balls) are attached to the second terminals 13E of the copper wiring layer 13 (FIG. 8(d)).

The lead frame 20 is then provided, and the second connecting members 18 are connected to the inner leads 21 of the lead frame 20 (FIG. 8(e)). Thereafter, the semiconductor wiring assembly 10, the semiconductor chip 15, the first connecting members 16, the second connecting members 18, and the inner leads 21 are all sealed by the resin seal 23 with part of the lead frame 20 (i.e., outer leads) exposed, thereby completing the semiconductor device 30 of FIG. 5 (FIG. 8(f)).

Described next with reference to FIGS. 15(*a*) to 15(*f*) is a modification of the above-described method for manufacturing the semiconductor device of FIG. 5.

Figure 6:
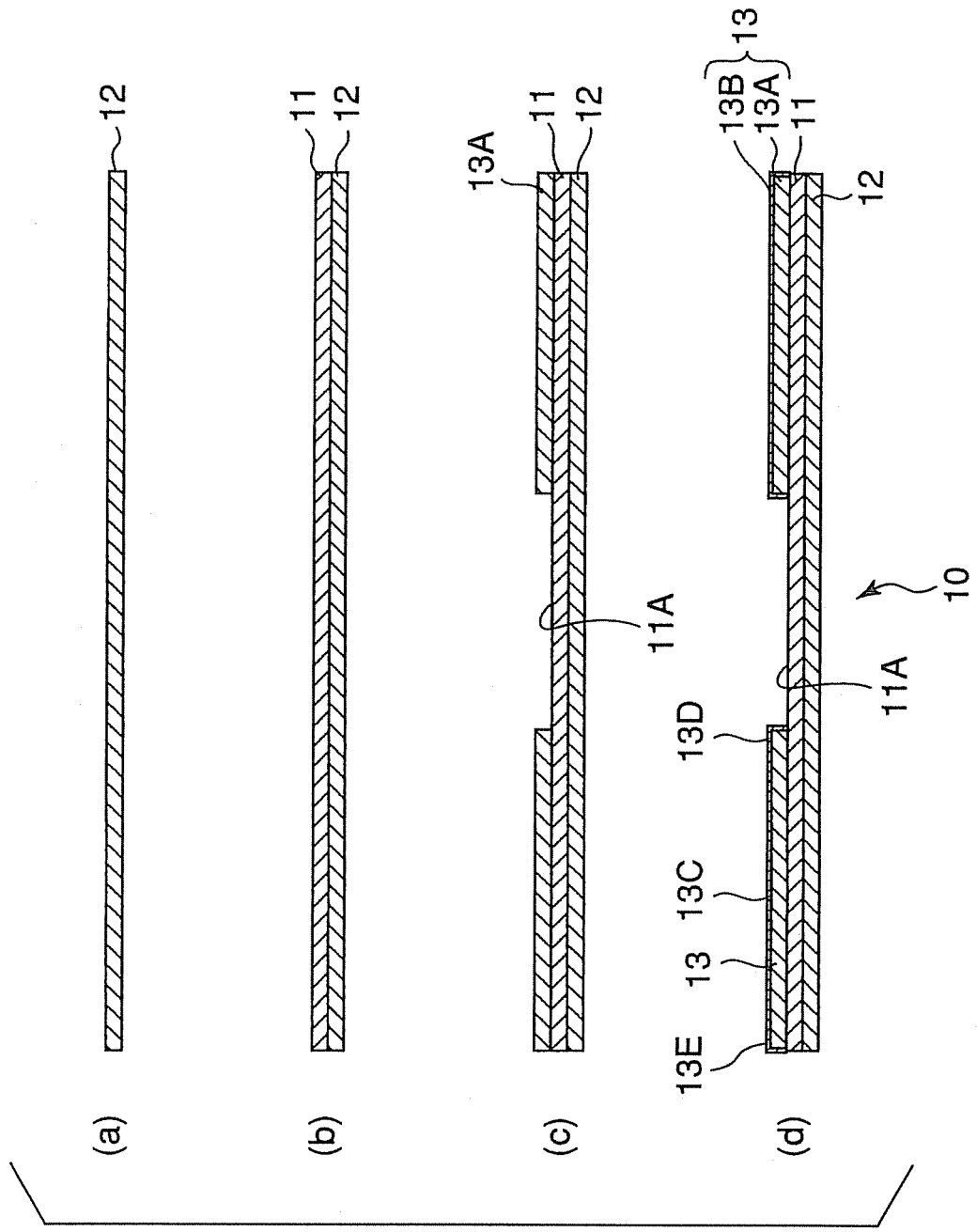
FIGS. 6(a) to 6(d) illustrate a method for manufacturing the wiring assembly of FIG. 1.
Figure 7:
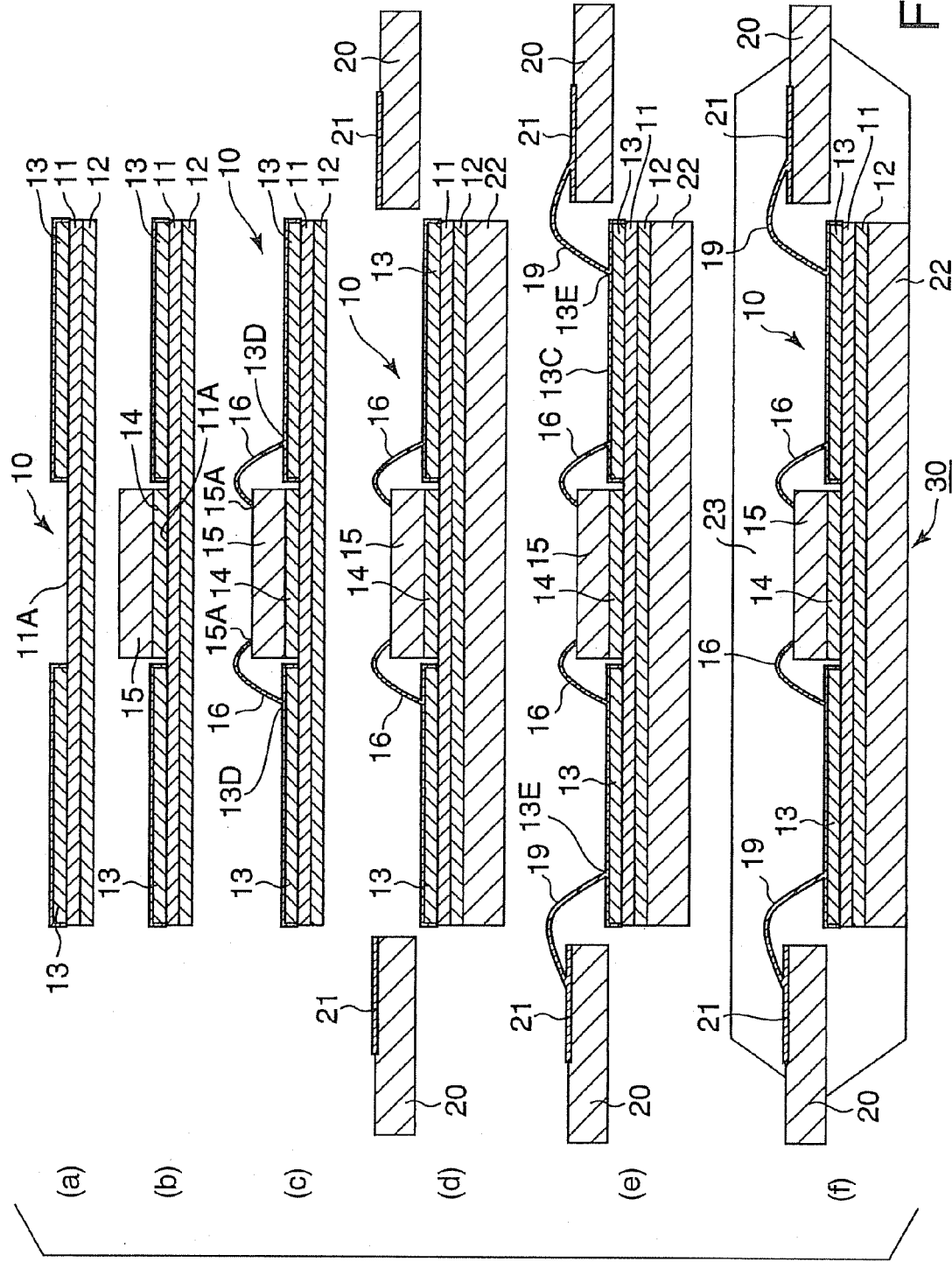
FIGS. 7(a) to 7(f) illustrate a method for manufacturing the semiconductor device of FIG. 4.
Figure 8:
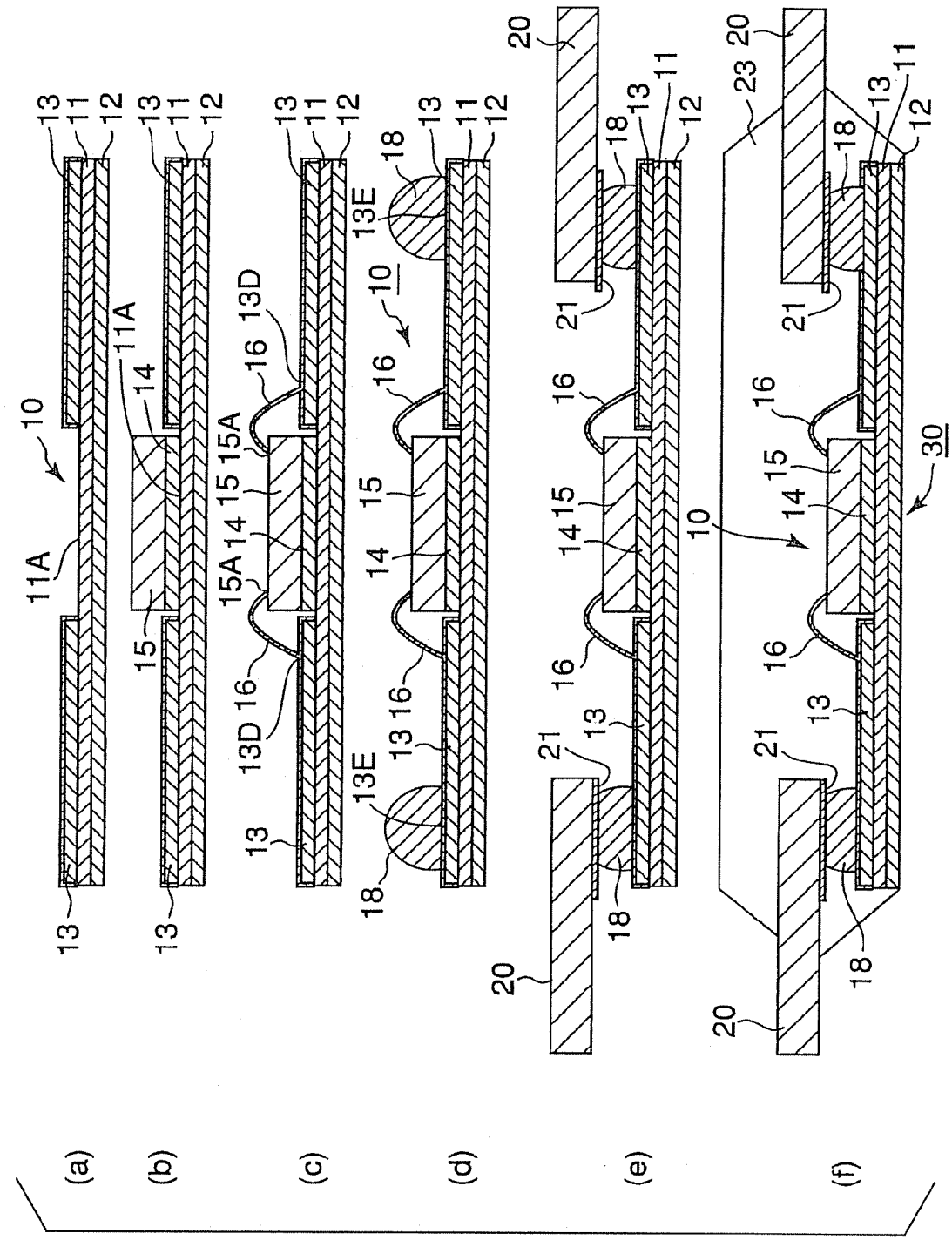
FIGS. 8(a) to 8(f) illustrate a method for manufacturing the semiconductor device of FIG. 5.
Figure 15:
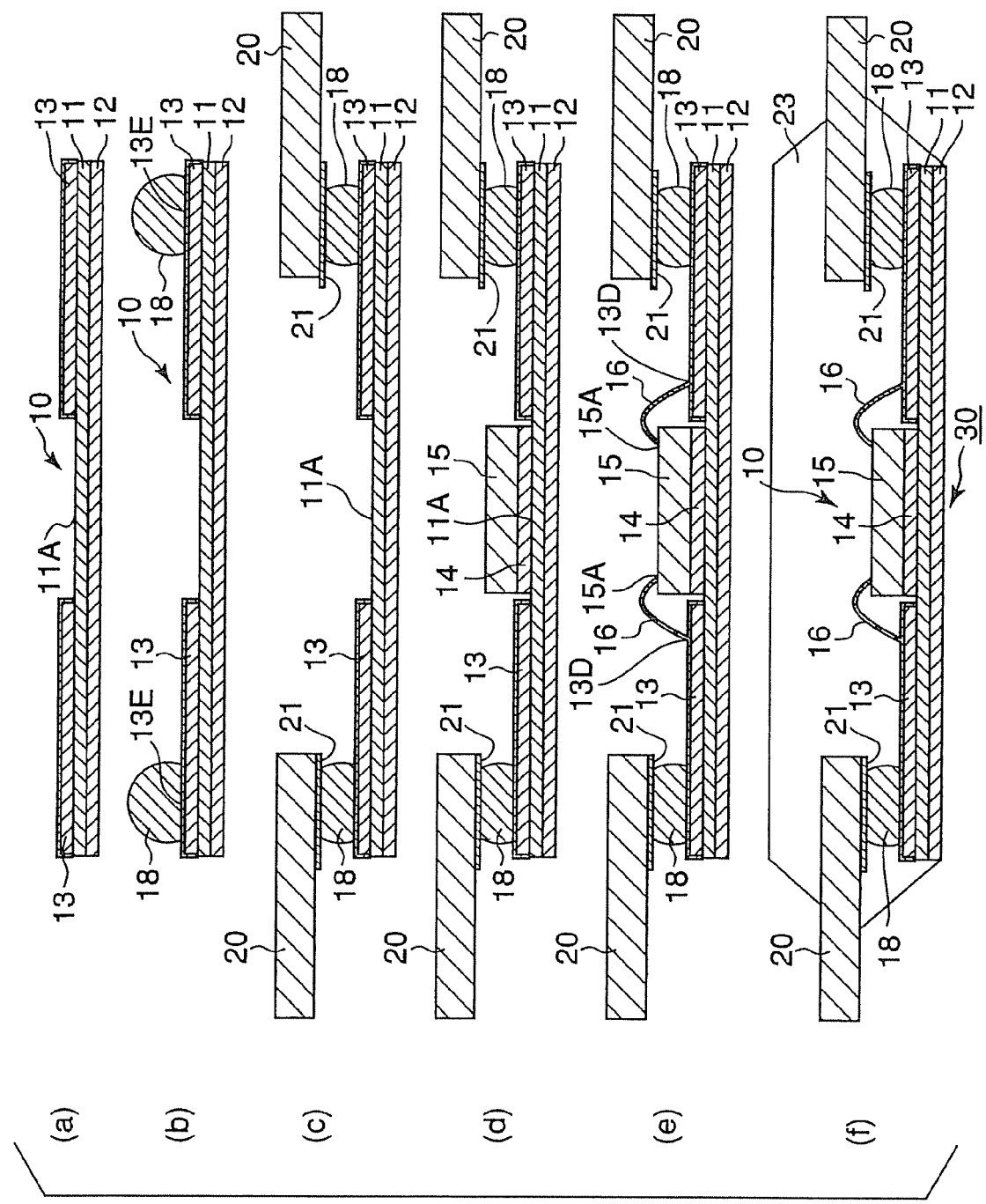
FIGS. 15(a) to 15(f) illustrate a modification of the method of FIG. 8 for manufacturing the semiconductor device of FIG. 5.

First, the above-described steps of FIGS. 6(*a*) to 6(*d*) are followed to manufacture the semiconductor wiring assembly 10 (FIG. 15(*a*)). Next, the second connecting members 18 (i.e., solder balls) are attached to the second terminals 13E of the copper wiring layer 13 of the semiconductor wiring assembly 10 (FIG. 15(*b*)). The lead frame 20 is then provided, and the second connecting members 18 are connected to the inner leads 21 of the lead frame 20 (FIG. 15(*c*)).

Next, the semiconductor chip 15 is glued to the chip placement section 11A of the semiconductor wiring assembly 10 via the adhesive layer 14 (FIG. 15(*d*)). Next, the first connecting members 16 (i.e., bonding wires) are used to connect the electrodes 15A of the semiconductor chip 15 to the first terminals 13D of the copper wiring layer 13 (FIG. 15(*e*)).

Thereafter, the semiconductor wiring assembly 10, the semiconductor chip 15, the first connecting members 16, the second connecting members 18, and the inner leads 21 are all sealed by the resin seal 23 with part of the lead frame 20 (i.e., outer leads) exposed, thereby completing the semiconductor device 30 of FIG. 5 (FIG. 15(*f*)).

The following are advantages resulting from Embodiment 1 of the invention.

Embodiment 1 allows a smaller semiconductor chip than conventional ones to be connected to the lead frame 20. The pitch of the inner leads 21 of the lead frame 20 is relatively large (e.g., 130 μm) and the pitch of the electrodes 15A of the semiconductor chip 15 is relatively small. Even in that case, Embodiment 1 ensures connection between the electrodes 15A of the semiconductor chip 15 and the first terminals 13D of the copper wiring layer 13 by the first connecting members 16 and connection between the second terminals 13E of the copper wiring layer 13 and the inner leads 21 of the lead frame 20 by the second connecting members 18 or 19. As a result, the semiconductor chip 15, even if smaller, can be electrically connected to the lead frame 20 in a reliable manner.

It is conceivable as a comparative example that gold bonding wires are used to directly connect the electrodes 15A of the semiconductor chip 15 to the inner leads 21 of the lead frame 20. However, this method requires those wires to be relatively large in length, hence higher manufacturing costs. In Embodiment 1, in contrast, the copper wiring layer 13 is present between the first connecting members 16 and the second connecting members 18 or 19. Therefore, the manufacturing cost of the semiconductor device 30 can be reduced, compared with the comparative example.

In addition, Embodiment 1 allows the semiconductor chip 15, before integrated into the semiconductor device 30, to be inspected even when the semiconductor chip 15 is mounted on the semiconductor wiring, assembly 10.

Further, since the metal substrate 12 of Embodiment 1 is made of stainless steel, it is more rigid and thinner and can be handled more easily than conventional polyimide substrates. The use of stainless steel is also advantageous in that the heat of the semiconductor chip 15 can be released from the bottom surface of the metal substrate 12.

Furthermore, the examples of FIGS. 1, 3, and 5 result in thinner semiconductor devices since the die pad 22 is absent. Moreover, the examples of FIGS. 3 and 5 lead to a decrease in the cost of gold because gold bonding wires (i.e., the first connecting members 16) are used to connect only the electrodes 15A of the semiconductor chip 15 and the first terminals 13D of the copper wiring layer 13.

Figure 9:
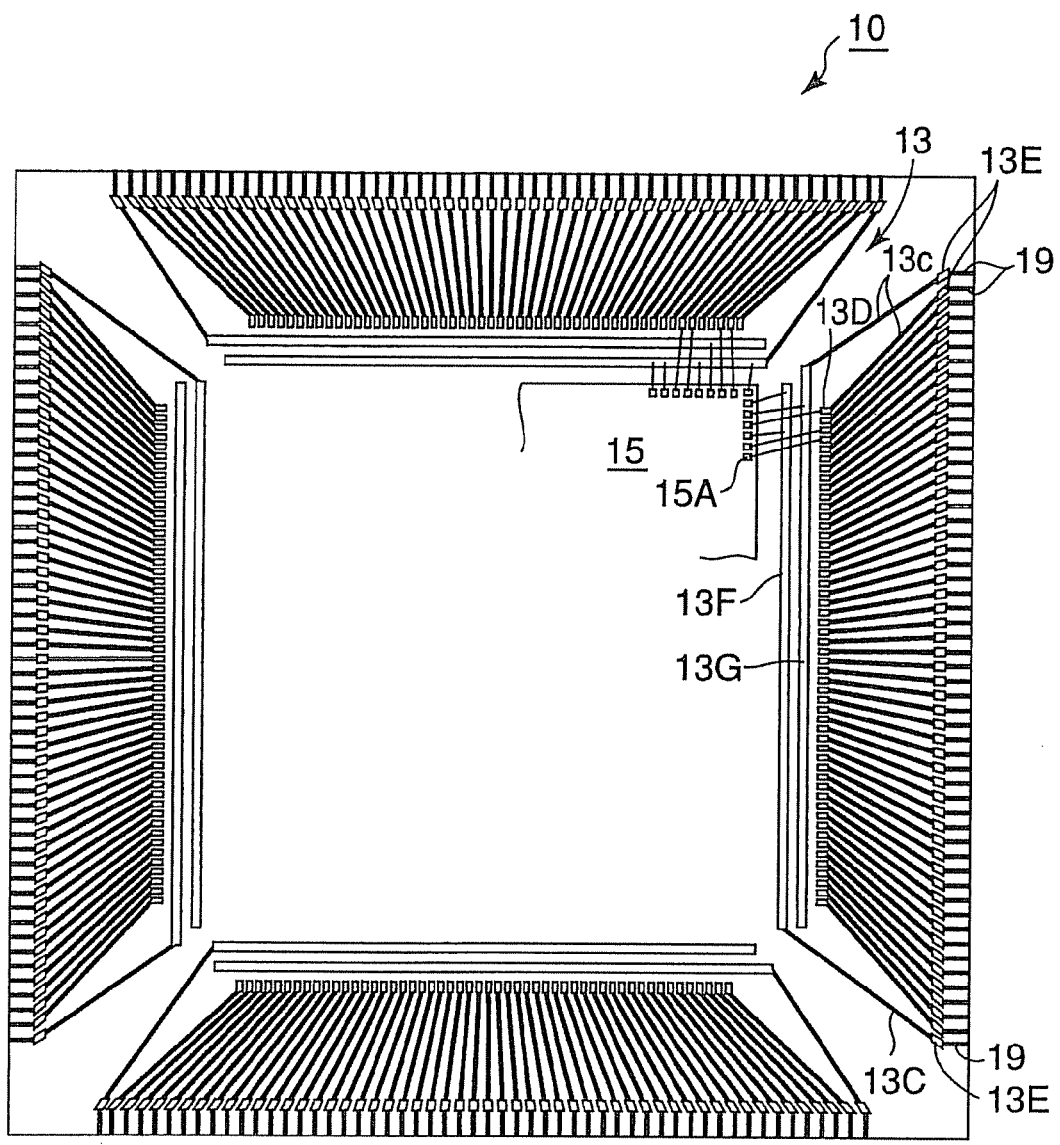
FIG. 9 is a plan view illustrating Modification 2 of the wiring assembly of FIG. 1.
Figure 10:
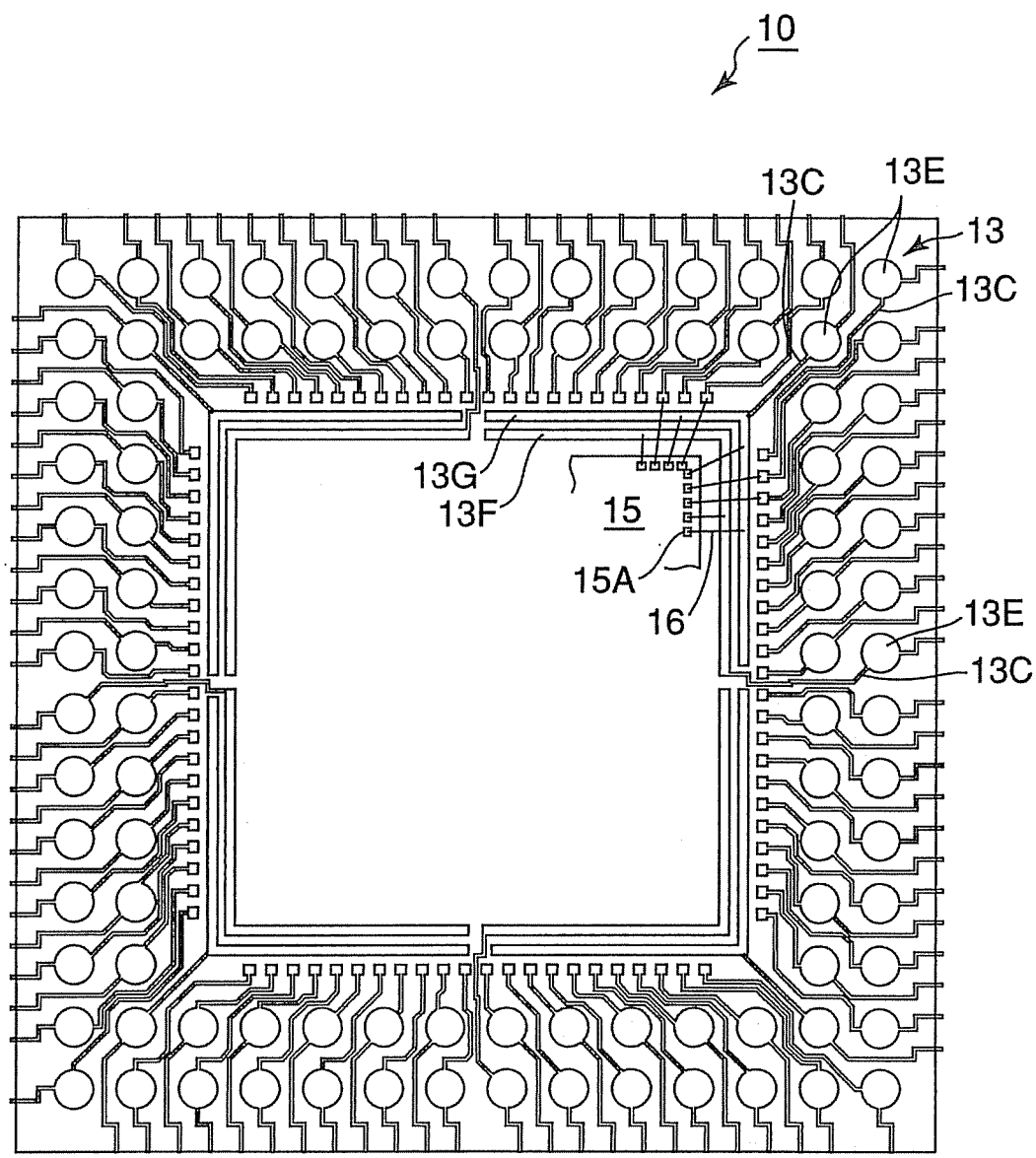
FIG. 10 is a plan view illustrating Modification 3 of the wiring assembly of FIG. 1.

With reference now to FIGS. 9 through 11, other possible configurations of the semiconductor wiring assembly 10 are discussed (Modifications 2 to 4). In FIGS. 9 to 11, the same components as used in the semiconductor wiring assemblies 10 of FIGS. 1 to 3 are assigned the same reference numerals and will not be discussed further in detail.

The copper wiring layer 13 of FIG. 9 (Modification 2) includes the following components: power supply terminal blocks 13F; ground terminal blocks 13G; the first terminals 13D; and the second terminals 13E. Each of the power supply terminal blocks 13F is electrically connected to some of the electrodes 15A of the semiconductor chip 15 by some of the first connecting members 16. Each of the ground terminal blocks 13G is also connected electrically to some of the electrodes 15A of the semiconductor chip 15 by some of the first connecting members 16. The first terminals 13D are electrically connected to the rest of the electrodes 15A of the semiconductor chip 15 by the rest of the first connecting members 16. The second terminals 13E are each parallelogram-shaped and each connected to one of the second connecting members 19. As illustrated in FIG. 9, one end of each of the power supply terminal blocks 13F is connected to one of the second terminals 13E by one of the wiring sections 13C, and one end of each of the ground terminal blocks 13G is connected to one of the second terminals 13E by one of the wiring sections 13C. The first terminals 13D and the second terminals 13E are also connected by the rest of the wiring sections 13C.

The copper wiring layer 13 of FIG. 10 (Modification 3) also includes the power supply terminal blocks 13F, the ground terminal blocks 13G, the first terminals 13D, and the second terminals 13E. Each of the power supply terminal blocks 13F is electrically connected to some of the electrodes 15A of the semiconductor chip 15 by some of the first connecting members 16. Each of the ground terminal blocks 13G is also connected electrically to some of the electrodes 15A of the semiconductor chip 15 by some of the first connecting members 16. The first terminals 13D are electrically connected to the rest of the electrodes 15A of the semiconductor chip 15 by the rest of the first connecting members 16. The second terminals 13E are each circular in shape and each connected to one of the second connecting members 18. As illustrated in FIG. 10, one end of each of the power supply terminal blocks 13F is connected to one of the second terminals 13E by one of the wiring sections 13C, and the corner of each of the ground terminal blocks 13G is connected to one of the second terminals 13E by one of the wiring sections 13C. The first terminals 13D and the second terminals 13E are also connected by the rest of the wiring sections 13C. The wiring sections 13C of FIG. 10 and their associated leads are crank-shaped or zigzag-shaped so as to prevent an overflow of solder when solder balls (i.e., the second connecting members 18) are attached to the second terminals 13E.

The modifications of FIGS. 9 and 10 can reduce the number of the second connecting members 18 or 19 because some of the electrodes 15A are not connected to the first terminals 13D but to the power supply terminal blocks 13F and the ground terminal blocks 13G.

Figure 11A:
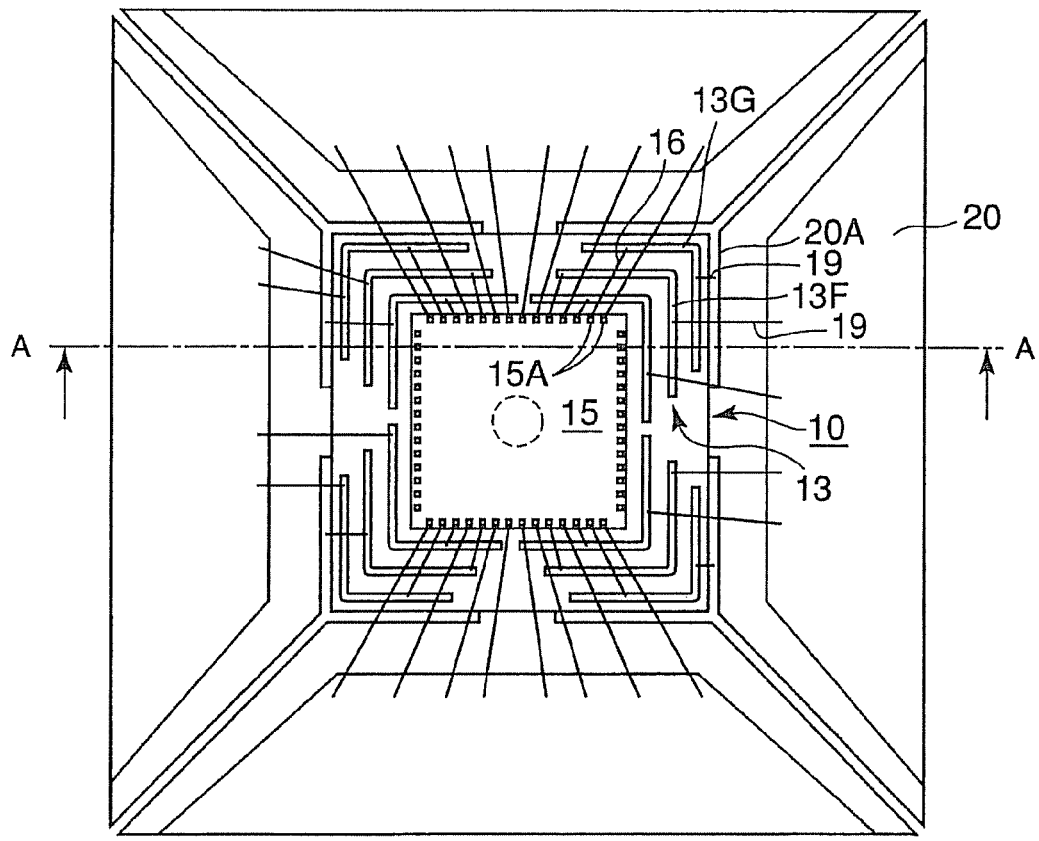
FIG. 11A is a plan view illustrating Modification 4 of the wiring assembly of FIG. 1.
Figure 11B:
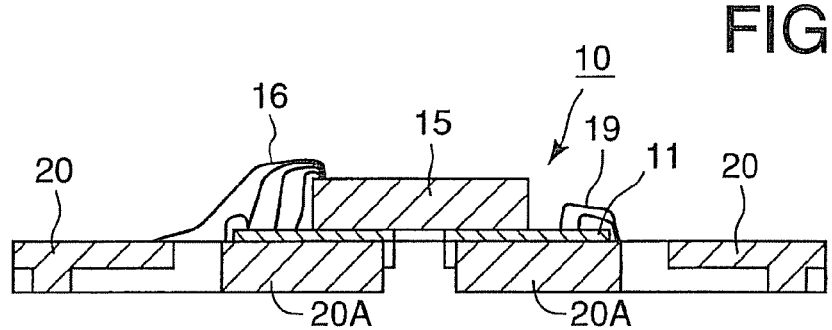
FIG. 11B is a cross section taken along line A-A of FIG. 11A.

In FIGS. 11A and 11B (Modification 4), the semiconductor wiring assembly 10 is mounted on two die pads 20A which are collectively slightly larger in surface area than the semiconductor wiring assembly 10. The copper wiring layer 13 includes the power supply terminal blocks 13F, which are electrically connected to some of the electrodes 15A of the semiconductor chip 15 by some of the first connecting members 16, and the ground terminal blocks 13G, which are electrically connected to some of the electrodes 15A of the semiconductor chip 15 by some of the first connecting members 16. The die pads 20A serve as ground blocks and are connected to the ground terminal blocks 13G by some of the second connecting members 19.

The modification of FIGS. 11A and 11B can reduce the number of the second connecting members 19 to be used in a semiconductor device by electrically connecting some of the electrodes 15A to the power supply terminal blocks 13F and to the ground terminal blocks 13G and connecting the die pads 20A to the ground terminal blocks 13G via some of the second connecting members 19.

In the above-described Modifications 2 to 4 (FIGS. 9 to 11), the semiconductor chip 15 can instead be mounted on a die pad that includes a copper wiring layer larger in area than the semiconductor chip 15 with an insulating film or paste inserted therebetween. In that case, the number of terminals to be used in a semiconductor device can be reduced by making the die pad serve as a ground layer and connecting the electrodes 15A of the semiconductor chip 15 to the die pad via wires.

Embodiment 2

With reference now to FIGS. 12 and 13(a) through 13(e), Embodiment 2 of the invention is described. Embodiment 2 illustrated in those figures differs from Embodiment 1 in that the second connecting members of Embodiment 2 are partially exposed (i.e., protrude from the resin seal 23). The rest is substantially the same as in Embodiment 1. In FIGS. 12 and 13(a) through 13(e), the same components as used in Embodiment 1 (FIGS. 1 through 11, 14, and 15) are assigned the same reference numerals and will not be discussed further in detail.

Figure 12:
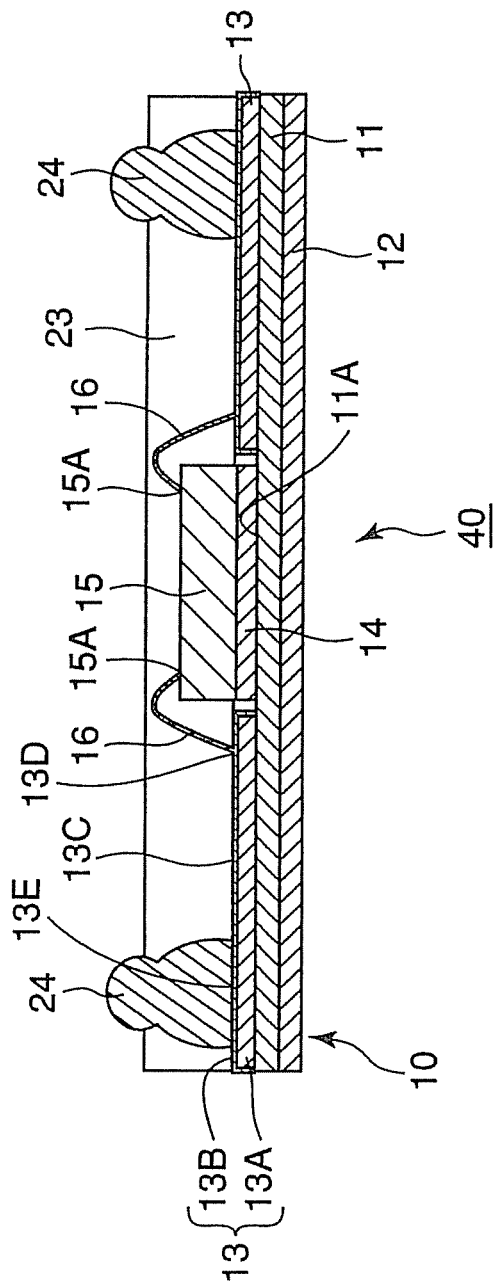
FIG. 12 is a cross-sectional view of a package-type semiconductor device according to Embodiment 2 of the invention.

As illustrated in FIG. 12, a package-type semiconductor device 40 according to Embodiment 2 includes the semiconductor wiring assembly 10 and the semiconductor chip 15 having the electrodes 15A. The semiconductor chip 15 is placed on the chip placement section 11A of the semiconductor wiring assembly 10 via the adhesive layer 14.

The first connecting members 16 (i.e., gold bonding wires) are used to connect the electrodes 15A of the semiconductor chip 15 to the first terminals 13D of the copper wiring layer 13.

A second connecting member 24 is attached to each of the second terminals 13E of the copper wiring layer 13. As illustrated in FIG. 12, each of the second connecting members 24 is made up of two solder balls stacked vertically and used for external connection. The second connecting members 24 can be made otherwise as long as their height can be made larger than a particular value.

The copper wiring layer 13, the semiconductor chip 15, and the first connecting members 16 are sealed with the resin seal 23. Not sealed with the resin seal 23, part of the second connecting members 24 protrudes outward, hence exposed. The exposed portions of the second connecting members 24 are used for electrical connection with electrical conductors of an external device and allow the semiconductor chip 15 to be electrically connected to the external device in a reliable manner.

The most suitable material for the metal substrate 12 is stainless steel although other types of metal can also be used. The use of stainless steel increases the rigidity of the metal substrate 12 and reduces its thickness and is advantageous in that the heat of the semiconductor chip 15 can be released from the bottom surface of the metal substrate 12.

With reference now to FIGS. 13(a) to 13(e), a possible method is described for manufacturing the semiconductor device 40 of FIG. 12.

Figure 13:
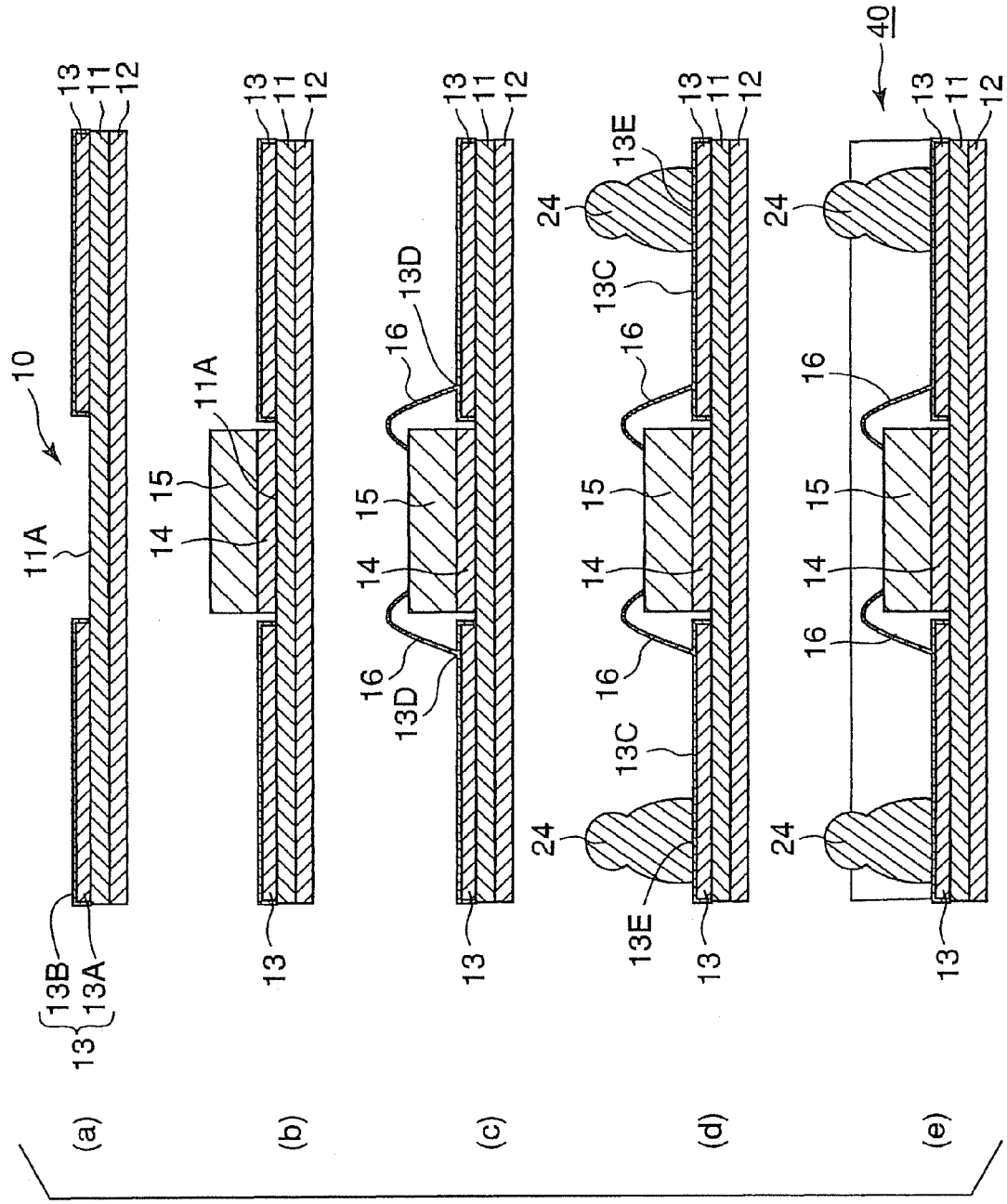
FIGS. 13(a) to 13(e) illustrate a method for manufacturing the semiconductor device of FIG. 12.
Figure 14:
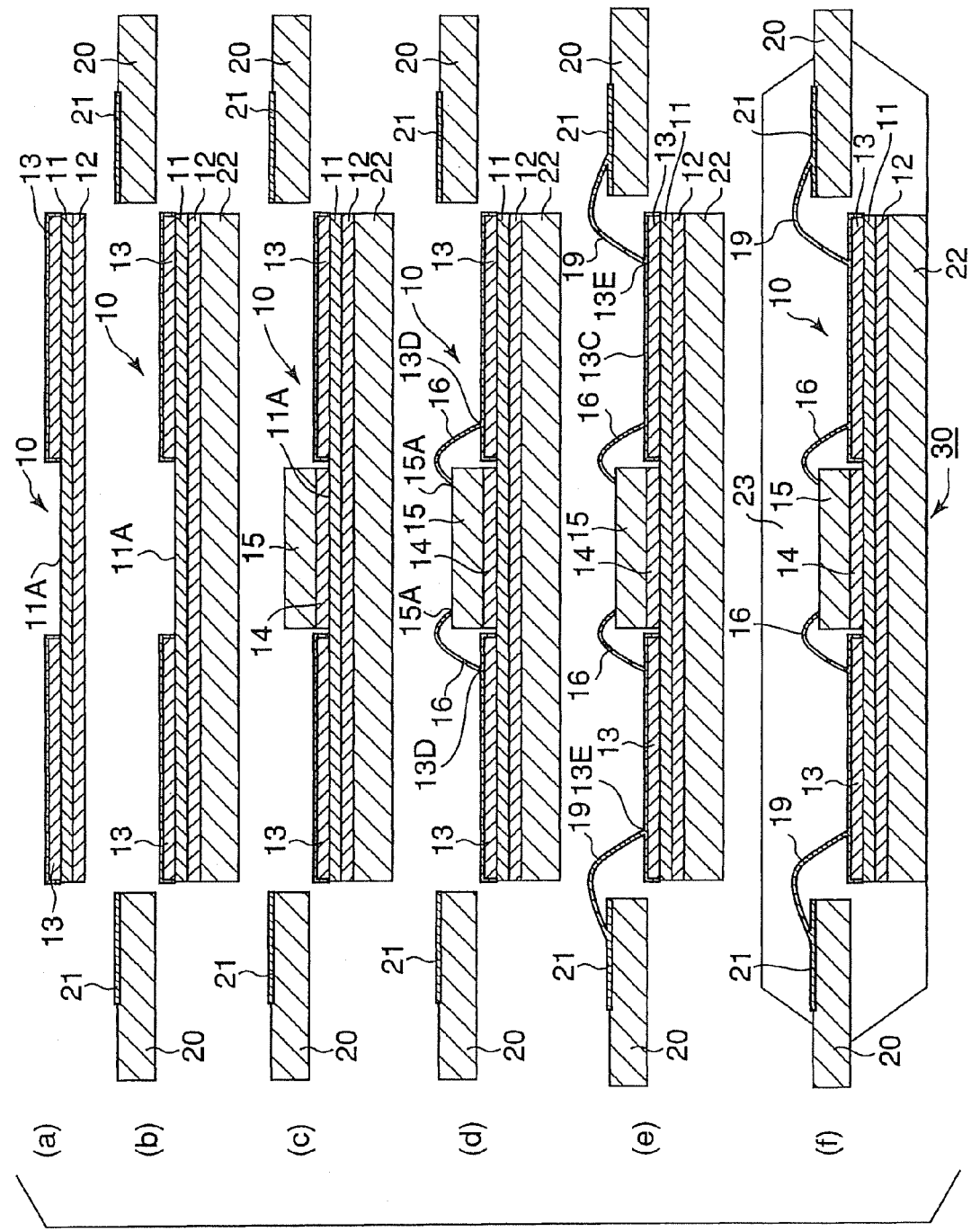
FIGS. 14(a) to 14(f) illustrate a modification of the method of FIG. 7 for manufacturing the semiconductor device of FIG. 4.

First, the steps of FIGS. 6(a) to 6(d) are followed to manufacture the semiconductor wiring assembly 10 (FIG. 13(a)). The semiconductor chip 15 is then glued to the chip placement section 11A of the semiconductor wiring assembly 10 via the adhesive layer 14 (FIG. 13(b)). Next, the first connecting members 16 (i.e., bonding wires) are used to connect the electrodes 15A of the semiconductor chip 15 to the first terminals 13D of the copper wiring layer 13 (FIG. 13(c)).

Next, the second connecting members 24 (i.e., solder balls) are attached to the second terminals 13E of the copper wiring layer 13 (FIG. 13(d)). Thereafter, the resin seal 23 is used to seal the copper wiring layer 13, the semiconductor chip 15, and the first connecting members 16, thereby completing the semiconductor device 40 of FIG. 12 (FIG. 13(e)).

Embodiment 2 allows a smaller semiconductor chip than conventional ones to be connected to an external device. As stated above, the electrodes 15A of the semiconductor chip 15 are connected to the first terminals 13D of the copper wiring layer 13 by the first connecting members 16, and the second connecting members 24 (solder balls for external connection) are attached to the second terminals 13E of the copper wiring layer 13. This configuration allows the semiconductor chip 15 to be electrically connected to an external device in a reliable manner even when the pitch of the electrical conductors of the external device is relatively large and the pitch of the electrodes 15A of the semiconductor chip 15 is relatively small (e.g., 40 µm).

Since the copper wiring layer 13 is present between the first connecting members 16 and the second connecting members 24, Embodiment 2 also allows reduction in the manufacturing cost of the semiconductor device 40, which would be lower than when gold bonding wires are used to directly connect the electrodes 15A of the semiconductor chip 15 to the second connecting members 24.

Further, since the metal substrate 12 of Embodiment 2 is made of stainless steel, it is more rigid and thinner and can be handled more easily than conventional polyimide substrates. The use of stainless steel is also advantageous in that the heat of the semiconductor chip 15 can be released from the bottom surface of the metal substrate 12.

Figure 20:
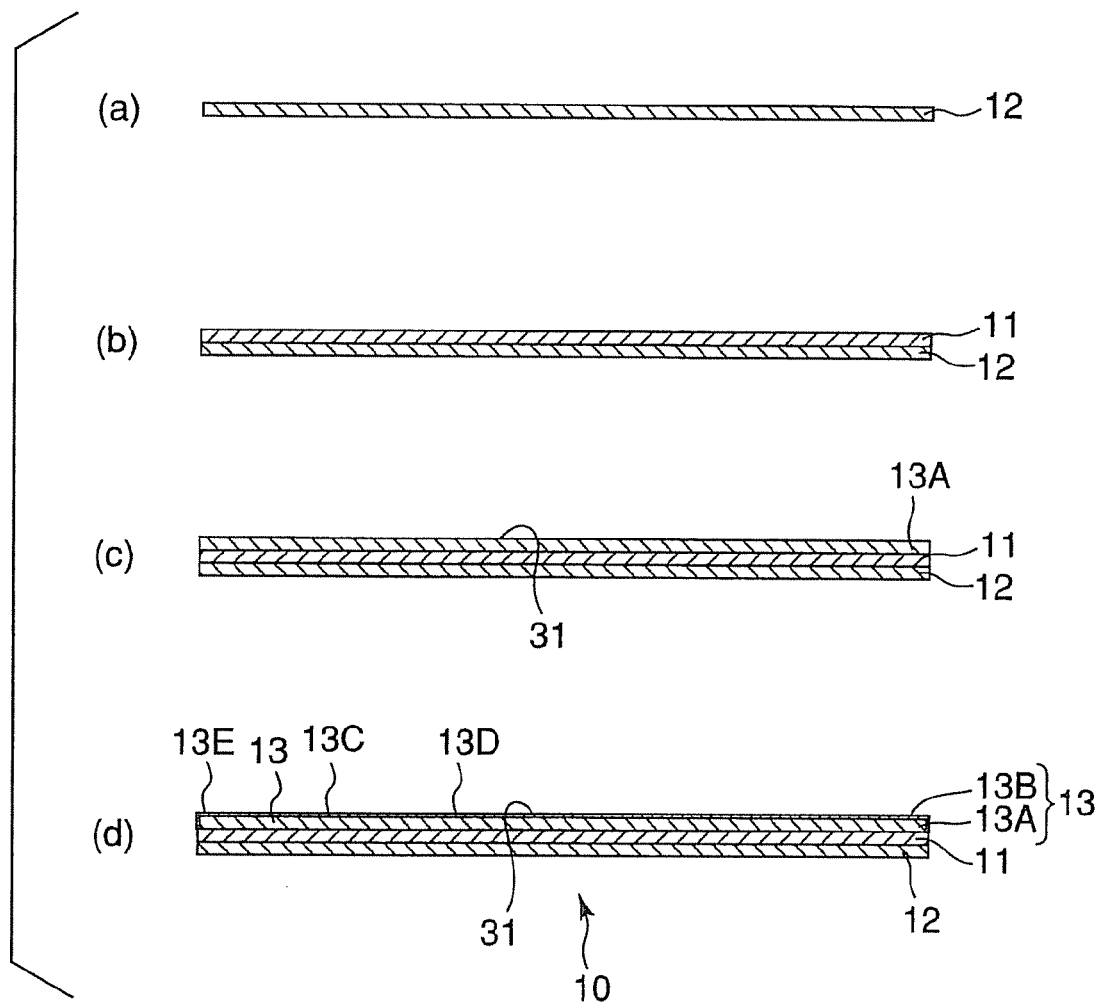
FIGS. 20(a) to 20(d) illustrate a method for manufacturing the semiconductor wiring assembly of FIG. 16.
Figure 21:
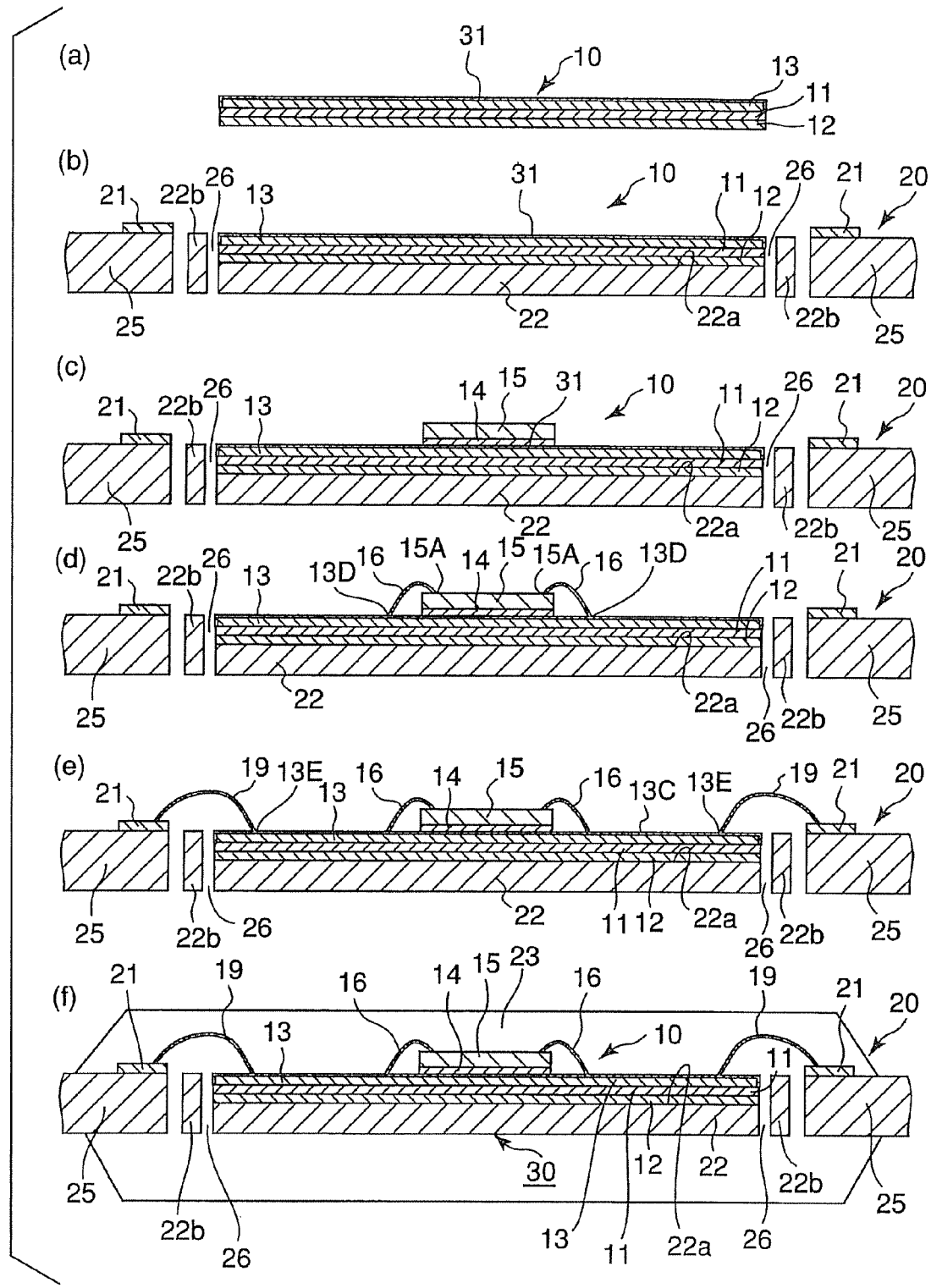
FIGS. 21(a) to 21(f) illustrate a method for manufacturing the semiconductor device of FIG. 19.

It should be noted that the semiconductor wiring assemblies of FIGS. 6, 9, and 20 (described later) and the semiconductor device 40 of FIG. 12 are obtained by separating them by a dicer from a single board on which a large number of such assemblies or devices are formed. Thus, difficulties may be involved in cutting such assemblies or devices apart because their metal substrates 12 are made of stainless steel. In that case, cut lines wider than the blades of the dicer can be formed in advance on the metal substrates 12 using half or full etching so that the cutting can be performed effectively.

Note also that in Embodiments 1 and 2, the chip placement section 11A can be formed on the copper wiring layer 13 instead of being formed on the insulating layer 11. In that case, the semiconductor chip 15 can be mounted on the chip placement section 11A with an insulating film or paste inserted therebetween.

Embodiment 3

With reference now to FIGS. 16 through 21, Embodiment 3 of the invention is described. In FIGS. 16 through 21, the same components as used in Embodiment 1 (FIGS. 1 through 11, 14, and 15) are assigned the same reference numerals and will not be discussed further in detail.

Figure 16:
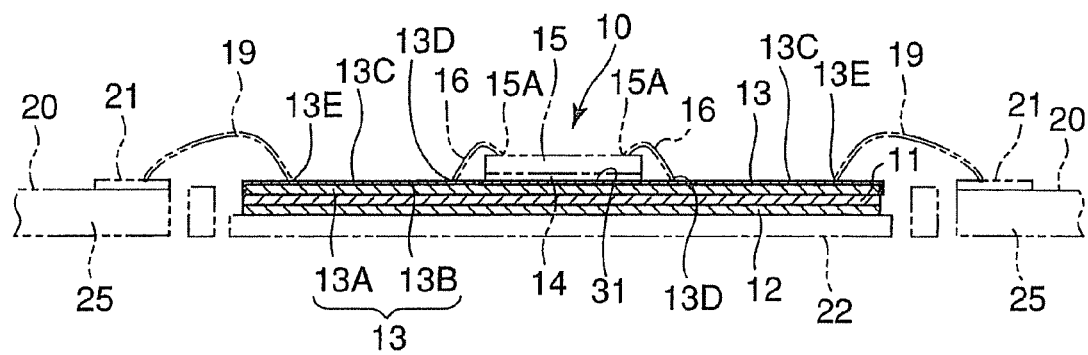
FIG. 16 is a cross-sectional view of a semiconductor wiring assembly according to Embodiment 3 of the invention.

With reference first to FIG. 16, a semiconductor wiring assembly according to Embodiment 3 is described. The dashed double-dotted lines of FIG. 16 represent components other than those of the semiconductor wiring assembly.

The semiconductor wiring assembly 10 (wired type) of FIG. 16 includes the insulating layer 11 made of polyimide or the like; the metal substrate 12 placed on one surface of the insulating layer 11; and the copper wiring layer 13 placed on the opposite surface of the insulating layer 11. The copper wiring layer 13 includes the first terminals 13D, the second terminals 13E, and the wiring sections 13C. Each first terminal 13D is to be connected electrically to one of the electrodes 15A of the semiconductor chip 15. Each second terminal 13E is to be connected electrically to one of the inner leads 21 (external wiring). Each wiring section 13C electrically connects one of the first terminals 13D to one of the second terminals 13E.

The most suitable material for the metal substrate 12 is stainless steel although other types of metal can also be used. The use of stainless steel increases the rigidity of the metal substrate 12 and reduces its thickness and is advantageous in that the heat of the semiconductor chip 15 can be released from the bottom surface of the metal substrate 12.

A chip placement section 31 is formed on the copper wiring layer 13 so that the semiconductor chip 15 can be glued to the chip placement section 31 via the adhesive layer 14. The semiconductor chip 15 has the electrodes 15A that are arranged along the periphery of the semiconductor chip 15. The electrodes 15A of the semiconductor chip 15 and the first terminals 13D of the copper wiring layer 13 are to be electrically connected by the first connecting members 16, each of which is a gold (Au) bonding wire.

The second terminals 13E of the copper wiring layer 13 and the inner leads 21 of the lead frame 20 are to be electrically connected by the second connecting members 19.

Figure 17:
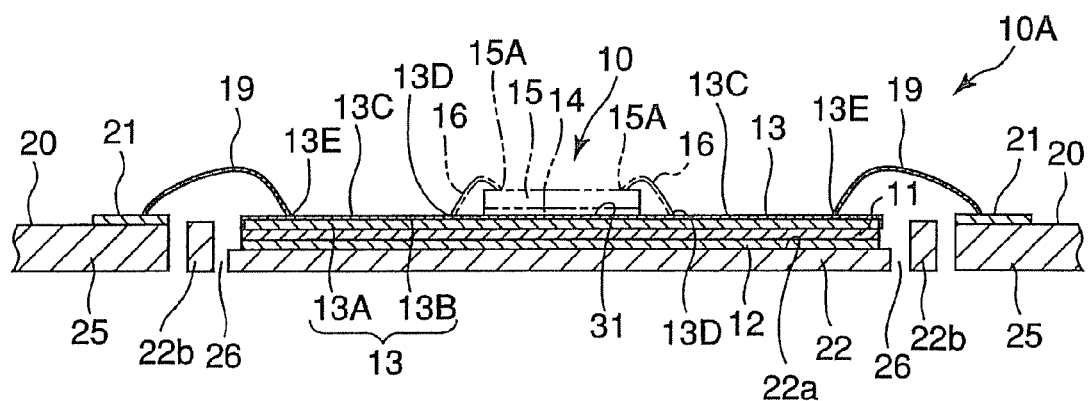
FIG. 17 is a cross-sectional view of a semiconductor composite wiring assembly according to Embodiment 3.

With reference first to FIG. 17, a semiconductor composite wiring assembly according to Embodiment 3 is described. The dashed double-dotted lines of FIG. 17 represent components other than those of the semiconductor composite wiring assembly.

The semiconductor composite wiring assembly 10A of FIG. 17 includes the semiconductor wiring assembly 10 of FIG. 16; the lead frame 20 electrically connected to the semiconductor wiring assembly 10; and the second connecting members 19 that electrically connect the second terminals 13E of the copper wiring layer 13 to the lead frame 20. The semiconductor composite wiring assembly 10A is used to electrically connect the electrodes 15A of the semiconductor chip 15 to an external wiring board (not illustrated).

The lead frame 20 includes the die pad 22 on which to place the semiconductor wiring assembly 10; and lead sections 25 located at outer positions with respect to the die pad 22 (i.e., located around the die pad 22). The inner leads 21 (external wiring) formed by silver plating or palladium plating is provided on the lead sections 25.

The die pad 22 includes a central area 22a and a peripheral area 22b. The central area 22a is the area in which to place the semiconductor chip 15. The peripheral area 22b is located at outer positions with respect to the central area 22a and substantially the same in thickness as the lead sections 25. The spaces between the central area 22a and the peripheral area 22b serve as slit apertures 26. As will be discussed later in more detail, the slit apertures 26 are provided to release the gas stemming from the adhesive that glues the semiconductor wiring assembly 10 and the lead frame 20.

At least the central area 22a of the die pad 22 is formed by half etching or the like so that the central area 22a is thinner than the peripheral area 22b and the lead sections 25. This allows reduction in the thickness of the semiconductor device 30 on which the semiconductor chip 15 is mounted.

The second connecting members 19 are gold bonding wires. One end of each of the second connecting members 19 is connected to one of the second terminals 13E, and the other end of each of the second connecting members 19 is connected to one of the inner leads 21 of the lead frame 20.

Figure 18:
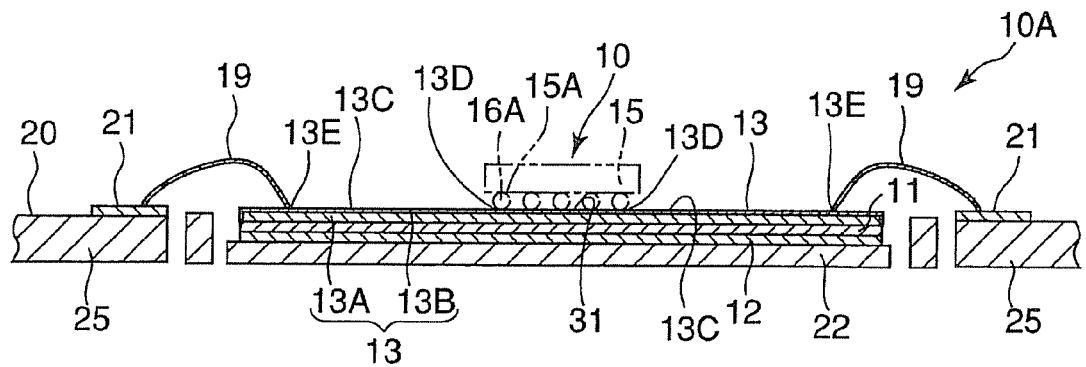
FIG. 18 is a cross-sectional view illustrating a modification of the semiconductor composite wiring assembly of FIG. 17.

FIG. 18 illustrates a modification of the structure of FIG. 17. As illustrated in FIG. 18, the electrodes 15A of the semiconductor chip 15 can instead face the copper wiring layer 13 so that the electrodes 15A can be connected to the first terminals 13D of the copper wiring layer 13 by first connecting members 16A which are bumps or solder balls (this connection method is called "flip chip"). In that case, manufacturing costs can be reduced because gold bonding wires need not be used as the first connecting members 16A.

Figure 19:
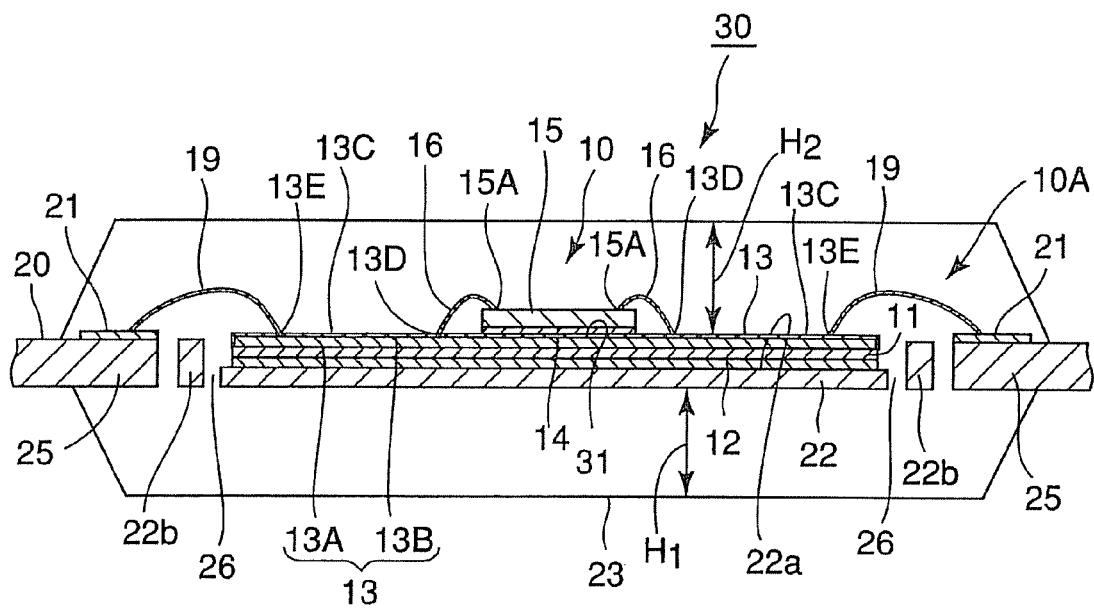
FIG. 19 is a cross-sectional view of a semiconductor device according to Embodiment 3.

Described next with reference to FIG. 19 is a semiconductor device having the semiconductor composite wiring assembly 10A of FIG. 17.

Specifically, the semiconductor device 30 of FIG. 19 includes the lead frame 20 having the die pad 22; the semiconductor wiring assembly 10 of FIG. 16 mounted on the die pad 22 of the lead frame 20 and electrically connected to the lead frame 20; and the semiconductor chip 15 having the electrodes 15A, which is placed on the chip placement section 31 of the semiconductor wiring assembly 10.

The inner leads 21 are formed on the top surface of the lead frame 20, and the second connecting members 19 (i.e., bonding wires) each electrically connect one of the second terminals 13E of the copper wiring layer 13 to one of the inner leads 21. Each of the first connecting members 16 (i.e., bonding wires) electrically connects one of the electrodes 15A of the semiconductor chip 15 to one of the first terminals 13D. The semiconductor chip 15, the copper wiring layer 13, the lead frame 20, the first connecting members 16, and the second connecting members 19 are all sealed by the resin seal 23 with the lead sections 25 of the lead frame 20 partially exposed.

The die pad 22 is constructed as described above with reference to FIG. 17, and its structure is not discussed further.

As illustrated in FIG. 19, the length $H_1$ from the bottom of the die pad 22 to the bottom of the resin seal 23 is substantially the same as the length $H_2$ from the semiconductor wiring assembly 10 to the top surface of the resin seal 23. This helps prevent the semiconductor device 30 from being bent or cracked during moisture (reflow) tests, as will be discussed later more in detail.

Next, effects of the aforementioned configurations according to the present embodiment are described below.

With reference next to FIGS. 20(a) to 20(d), a possible method is described for manufacturing the semiconductor wiring assembly 10 of FIG. 16.

First, the metal substrate 12 (preferably stainless steel) is provided (FIG. 20(a)). The insulating layer 11 made of polyimide is then deposited on the metal substrate 12 (FIG. 20(b)).

Next, the copper layer 13A is formed on the insulating layer 11 by an additive method or etching (FIG. 20(c)). Thereafter, the plated layer 13B made, for example, of a nickel-plated (Ni) layer and a gold-plated (Au) layer is formed on the copper layer 13A by electrolytic plating or non-electrolytic plating, thereby completing the copper wiring layer 13 having the copper layer 13A and the plated layer 13B (FIG. 20(d)). During the step of FIG. 20(d), the first terminals 13D, the second terminals 13E, and the wiring sections 13C are also formed. The above method results in the semiconductor wiring assembly 10 having the insulating layer 11, the metal substrate 12, and the copper wiring layer 13. The chip placement section 31 is also formed on the copper wiring layer 13.

With reference next to FIGS. 21(a) to 21(f), a possible method is described for manufacturing the semiconductor device 30 of FIG. 19.

First, the above-described steps of FIGS. 20(a) to 20(d) are followed to manufacture the semiconductor wiring assembly 10 (FIG. 21(a)). Next, the lead frame 20 having the inner leads 21 and the die pad 22 is provided, and the semiconductor wiring assembly 10 is glued to the die pad 22 by an adhesive (FIG. 21(b)). Because the semiconductor wiring assembly 10 is flat, it can be pressed uniformly against the die pad 22. This allows the semiconductor wiring assembly 10 to be firmly attached to the die pad 22 without any clearance therebetween.

The semiconductor chip 15 is then glued to the chip placement section 31 of the semiconductor wiring assembly 10 via the adhesive layer 14 (FIG. 21(c)). Next, the first connecting members 16 (i.e., bonding wires) are used to connect the electrodes 15A of the semiconductor chip 15 to the first terminals 13D of the copper wiring layer 13 (FIG. 21(d)).

Next, the second connecting members 19 (i.e., bonding wires) are used to connect the second terminals 13E of the copper wiring layer 13 to the inner leads 21 of the lead frame 20 (FIG. 21(e)). Thereafter, the semiconductor wiring assembly 10, the semiconductor chip 15, the first connecting members 16, the die pad 22, the second connecting members 19, and the inner leads 21 are all sealed by the resin seal 23 with part of the lead frame 20 (i.e., outer leads) exposed, thereby completing the semiconductor device 30 of FIG. 19 (FIG. 21(f)).

During the sealing with the resin seal 23, the semiconductor wiring assembly 10 and the die pad 22 are heated at a temperature of 180 degrees Celsius or thereabout. Thus, the adhesive that glues the semiconductor wiring assembly 10 and the die pad 22 is also heated during that time, and organic gas may emanate from the adhesive. Vapor is also likely to occur as the moisture of the adhesive is heated. In Embodiment 3, therefore, the slit apertures 26 are provided between the central area 22a and the peripheral area 22b of the die pad 22. The slit apertures 26 allow such gasses (organic gas and vapor) generated from the adhesive to be discharged outward after the semiconductor wiring assembly 10 and the semiconductor chip 15 are fixed by adhesive or until the resin seal 23 becomes solidified. Thus, those gasses have no chance of remaining in the resin seal 23.

If the slit apertures 26 are absent, the resin seal 23 becomes solidified with those gasses trapped near the boundary between the die pad 22 and the semiconductor wiring assembly 10. When a moisture (reflow) test is conducted for such a semiconductor device, the gas-trapped portion may swell, resulting in a crack. In Embodiment 3, by contrast, the presence of the slit apertures 26 in the die pad 22 allows gas from the adhesive to be discharged outward. Thus, there is no chance of cracks being generated in the semiconductor device 30 during reflow tests.

Advantages resulting from Embodiment 3 of the invention are summarized below.

Embodiment 3 allows a smaller semiconductor chip than conventional ones to be connected to the lead frame 20. The pitch of the inner leads 21 of the lead frame 20 is relatively large (e.g., 130 μm) and the pitch of the electrodes 15A of the semiconductor chip 15 are relatively small (e.g., 40 μm). Even in that case, the connection between the semiconductor chip 15 and the inner leads 21 of the lead frame 20 is ensured.

In addition, the semiconductor device 30 is thinner since the central area 22a of the die pad 22 on which to mount the semiconductor chip 15 is made thinner than the lead sections 25.

Embodiment 3 also prevents cracks from being generated in the semiconductor device 30 during reflow tests. This is achieved by providing the slit apertures 26 between the central area 22a and the peripheral area 22b of the die pad 22 so that the gas stemming from the adhesive that glues the semiconductor wiring assembly 10 and the lead frame 20 can be discharged outward through the slit apertures 26.

Moreover, as stated above, the length from the bottom of the die pad 22 to the bottom of the resin seal 23 is substantially the same as the length from the copper wiring layer 13 of the semiconductor wiring assembly 10 to the top surface of the resin seal 23. That is, the volume of the resin seal 23 is substantially equally divided between the upper and lower sides of the semiconductor device 30. As a result, the upper and lower portions of the resin seal 23 swell uniformly during a reflow test, thereby preventing the semiconductor device 30 from being bent or cracked.

Further, since the copper wiring layer 13 is present between the first connecting members 16 and the second connecting members 19, Embodiment 3 allows reduction in the manufacturing cost of the semiconductor device 30, which would be lower than when gold bonding wires are used to directly connect the electrodes 15A of the semiconductor chip 15 to the inner leads 21 of the lead frame 20.

Furthermore, since the metal substrate 12 of Embodiment 3 is made of stainless steel, it is more rigid and thinner and can be handled more easily than conventional polyimide substrates.

Embodiment 4

With reference now to FIGS. 22 through 25, Embodiment 4 of the invention is described. Embodiment 4 illustrated in those figures differs from Embodiment 2 in terms of second connecting members 27A and 27B, copper wiring layers 13, and chip placement sections 31; the rest is substantially the same as in Embodiment 2. In FIGS. 22 through 25, the same components as used in Embodiment 2 (FIGS. 12 and 13(a) through 13(e)) are assigned the same reference numerals and will not be discussed further in detail.

Figure 22:
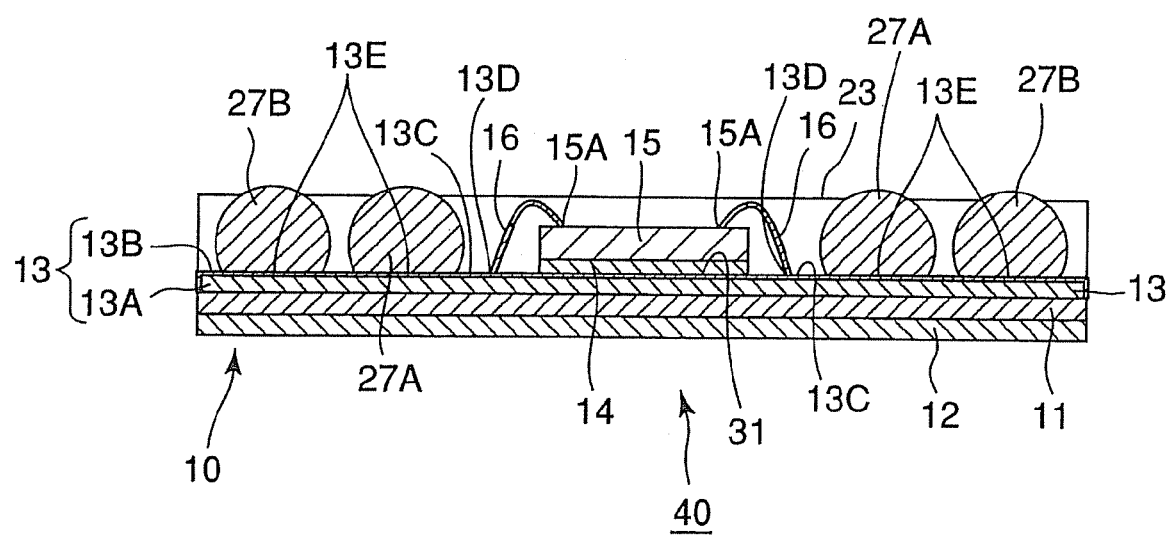
FIG. 22 is a cross-sectional view of a semiconductor device according to Embodiment 4 of the invention.

The package-type semiconductor device 40 of FIG. 22 includes the semiconductor wiring assembly 10 and the semiconductor chip 15 having the electrodes 15A. The semiconductor chip 15 is mounted on the chip placement section 31 via the adhesive layer 14. The chip placement section 31 is formed on the copper wiring layer 13 of the semiconductor wiring assembly 10.

The semiconductor wiring assembly 10 includes the insulating layer 11; the metal substrate 12 made, for example, of stainless steel; and the copper wiring layer 13. The copper wiring layer 13 includes the first terminals 13D that are each connected electrically to one of the electrodes 15A of the semiconductor chip 15; the second terminals 13E used for external connection; and the wiring sections 13C that each electrically connect one of the first terminals 13D and one of the second terminals 13E.

The first connecting members 16 (i.e., gold (Au) bonding wires) connect the electrodes 15A of the semiconductor chip 15 to the first terminals 13D of the copper wiring layer 13.

Second connecting members 27A and 27B are attached to the second terminals 13E of the copper wiring layer 13. The second connecting members 27A and 27B are each a solder ball and used for external connection. As illustrated in FIG. 22, the second connecting members 27A are those located closer to the semiconductor chip 15 (or to the first terminals 13D), and the second connecting members 27B are those located farther away from the semiconductor chip 15 (or from the first terminals 13D).

The copper wiring layer 13, the semiconductor chip 15, and the first connecting members 16 are sealed with the resin seal 23. The top portions of the second connecting members 27A and 27B each protrude outward from the resin seal 23, hence exposed. The exposed top potions are used for electrical connection, for example, with electrical conductors of an external device and allow the semiconductor chip 15 to be electrically connected to the external device.

The most suitable material for the metal substrate 12 is stainless steel although other types of metal can also be used. The use of stainless steel increases the rigidity of the metal substrate 12 and reduces its thickness and is advantageous in that the heat of the semiconductor chip 15 can be released from the bottom surface of the metal substrate 12.

Figure 23:
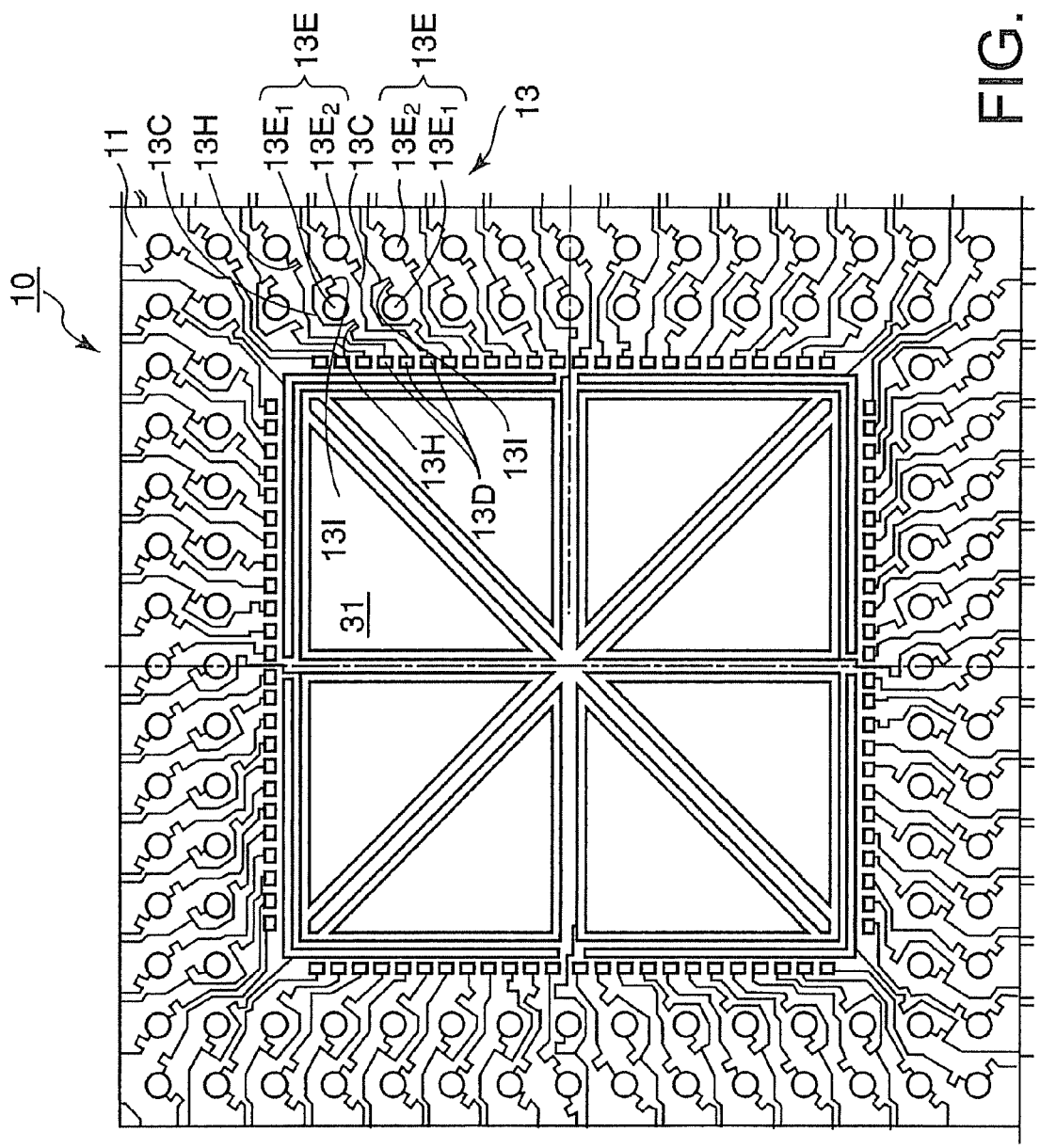
FIG. 23 is a plan view of the semiconductor wiring assembly mounted on the semiconductor device of FIG. 22.
Figure 24:
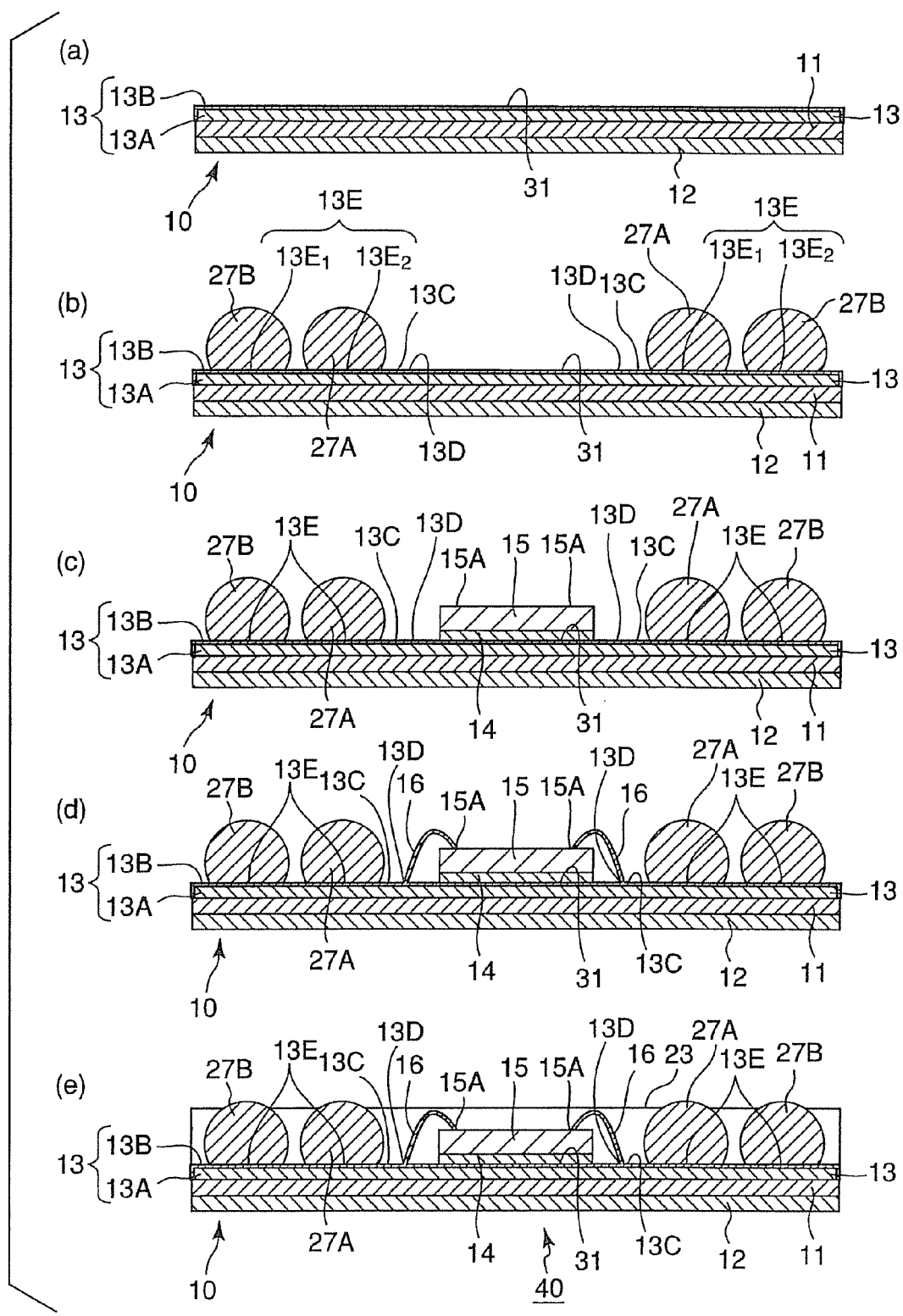
FIGS. 24(a) to 24(e) illustrate a method for manufacturing the semiconductor device of FIG. 22.

FIG. 23 is a plan view of the semiconductor wiring assembly 10 used in the semiconductor device 40 of Embodiment 4. As illustrated in the plan view of FIG. 23, the second terminals 13E of the copper wiring layer 13 are each circular in shape. In FIG. 23, the second terminals located closer to the first terminals 13D are indicated by reference numeral $13E_1$, and the second terminals located farther away from the first terminals 13D are indicated by reference numeral $13E_2$.

The wiring sections 13C of the copper wiring layer 13 each include a crank portion 13H, as can be seen in FIG. 23. The wiring sections 13C that connect the first terminals 13D to the second terminals $13E_1$ are shaped so as to surround the second terminals $13E_1$ (that is, those wiring sections 13C each have a surrounding portion 13I).

The presence of the crank portions 13H and the surrounding portions 13I is advantageous in the following respect. When the second connecting members 27A and 27B (solder balls) are soldered to the second terminals $13E_1$ and $13E_2$, respectively, molten solder tends to flow along the wiring sections 13C. During this time, the flowing molten solder is moved away from the first terminals 13D and prevented from reaching the first terminals 13D by the crank portions 13H and the surrounding parts 13I. If the wiring sections 13C are without the crank portions 13H and the surrounding portions 13I, in contrast, the molten solder is likely to reach the first terminals 13D. In this case, a failure may occur, in which the first connecting members 16 (i.e., bonding wires) cannot be connected with the first terminals 13D.

Figure 25:
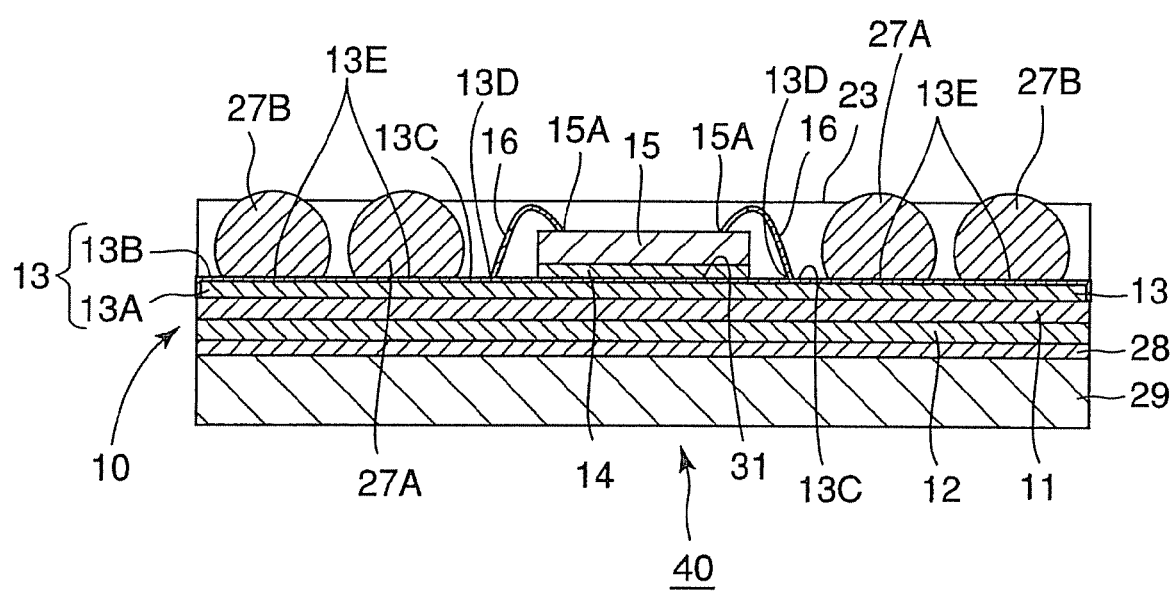
FIG. 25 is a cross-sectional view illustrating a modification of the semiconductor device of FIG. 22.

FIG. 25 illustrates a modification of the semiconductor device 40 of FIG. 22. As illustrated in the figure, a heatsink plate 29 can also be formed on the bottom surface of the metal substrate 12 via an adhesive layer 28. The adhesive layer 28 is made, for example, of a die-attach film, and the heatsink plate 29 is made, for example, of copper. Such a structure helps further enhance the heat release capabilities of the semiconductor device 40 because the heat of the semiconductor chip 15 can be released outward through the heatsink plate 29.

With reference now to FIGS. 24(a) to 24(e), a possible method is described for manufacturing the package-type semiconductor device 40 of FIG. 22.

First, the steps of FIGS. 20(a) to 20(d) are followed to manufacture the semiconductor wiring assembly 10 (FIG. 24(a)). Next, the second connecting members 27A and 27B (i.e., solder balls) are attached to the second terminals $13E_1$ and $13E_2$, respectively, of the copper wiring layer 13 (FIG. 24(b)). As stated above, those of the wiring sections 13C that connect the first terminals 13D to the second terminals $13E_1$ are shaped so as to surround the second terminals $13E_1$, as illustrated in FIG. 23. Thus, when the second connecting members 27A and 27B are formed (FIG. 24(b)), molten solder is prevented from reaching the first terminals 13D even if it flows along those wiring sections 13.

The semiconductor chip 15 is then glued to the chip placement section 31 of the semiconductor wiring assembly 10 via the adhesive layer 14 (FIG. 24(c)). Next, the first connecting members 16 (i.e., bonding wires) are used to connect the electrodes 15A of the semiconductor chip 15 to the first terminals 13D of the copper wiring layer 13 (FIG. 24(d)).

Thereafter, the copper wiring layer 13, the semiconductor chip 15, and the first connecting members 16 are sealed by the resin seal 23, thereby completing the semiconductor device 40 of FIG. 22 (FIG. 24(e)).

Embodiment 4 allows a smaller semiconductor chip than conventional ones to be connected to an external device. As stated above, the electrodes 15A of the semiconductor chip 15 are connected to the first terminals 13D of the copper wiring layer 13 by the first connecting members 16, and the second connecting members 27A and 27B (solder balls for external connection) are attached to the second terminals $13E_1$ and $13E_2$, respectively, of the copper wiring layer 13. This configuration allows the semiconductor chip 15 to be electrically connected to an external device in a reliable manner even when the pitch of the electrical conductors of the external device is relatively large and the pitch of the electrodes 15A of the semiconductor chip 15 is relatively small (e.g., 40 μm).

Since the copper wiring layer 13 is present between the first connecting members 16 and the second connecting members 27A and 27B, Embodiment 4 also allows reduction in the manufacturing cost of the semiconductor device 40, which would be lower than when gold bonding wires are used to directly connect the electrodes 15A of the semiconductor chip 15 to the second connecting members 27A and 27B.

Furthermore, since the metal substrate 12 of

Embodiment 4 is made of stainless steel, it is more rigid and thinner and can be handled more easily than conventional polyimide substrates. The use of stainless steel is also advantageous in that the heat of the semiconductor chip 15 can be released from the bottom surface of the metal substrate 12.

Embodiment 5

With reference now to FIGS. 26 through 30, Embodiment 5 of the invention is described. In those figures, the same components as used in Embodiment 1 (FIGS. 1 through 11, 14, and 15) and Embodiment 3 (FIGS. 16 through 21) are assigned the same reference numerals and will not be discussed further in detail.

Figure 26:
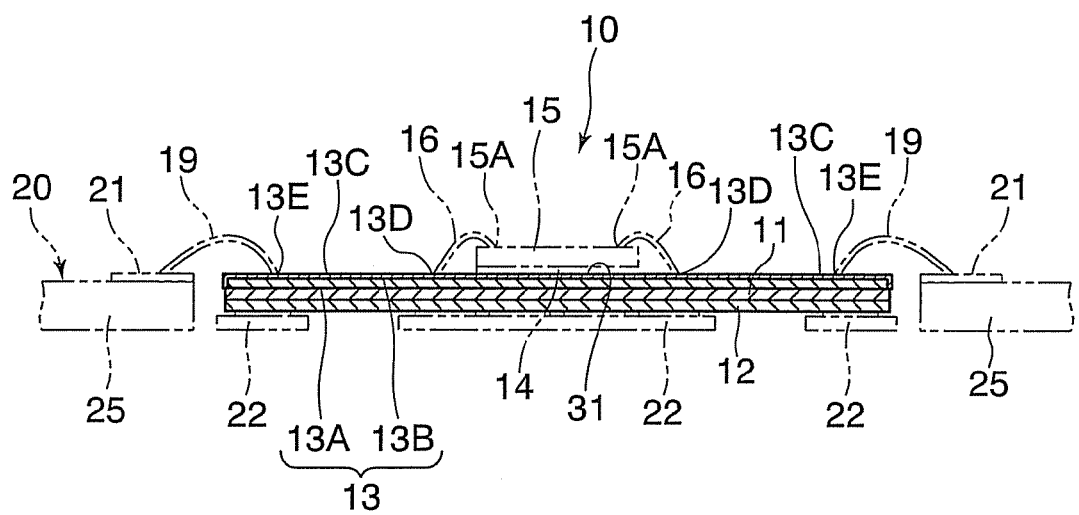
FIG. 26 is a cross-sectional view of a semiconductor wiring assembly according to Embodiment 5 of the invention.

With reference first to FIG. 26, a semiconductor wiring assembly according to Embodiment 5 is described. The dashed double-dotted lines of FIG. 26 represent components other than those of the semiconductor wiring assembly.

The semiconductor wiring assembly 10 (wired type) of FIG. 26 includes the insulating layer 11 made of polyimide or the like; the metal substrate 12 placed on one surface of the insulating layer 11; and the copper wiring layer 13 placed on the opposite surface of the insulating layer 11. The copper wiring layer 13 includes the first terminals 13D, the second terminals 13E, and the wiring sections 13C. Each first terminal 13D is to be connected electrically to one of the electrodes 15A of the semiconductor chip 15. Each second terminal 13E is to be connected electrically to one of the inner leads 21 (external wiring). Each wiring section 13C electrically connects one of the first terminals 13D to one of the second terminals 13E.

The most suitable material for the metal substrate 12 is stainless steel although other types of metal can also be used. The use of stainless steel increases the rigidity of the metal substrate 12 and reduces its thickness and is advantageous in that the heat of the semiconductor chip 15 can be released from the bottom surface of the metal substrate 12.

The chip placement section 31 is formed on the copper wiring layer 13 so that the semiconductor chip 15 can be placed on the chip placement section 31 via the adhesive layer 14. The semiconductor chip 15 has the electrodes 15A that are arranged along the periphery of the semiconductor chip 15.

Figure 27:
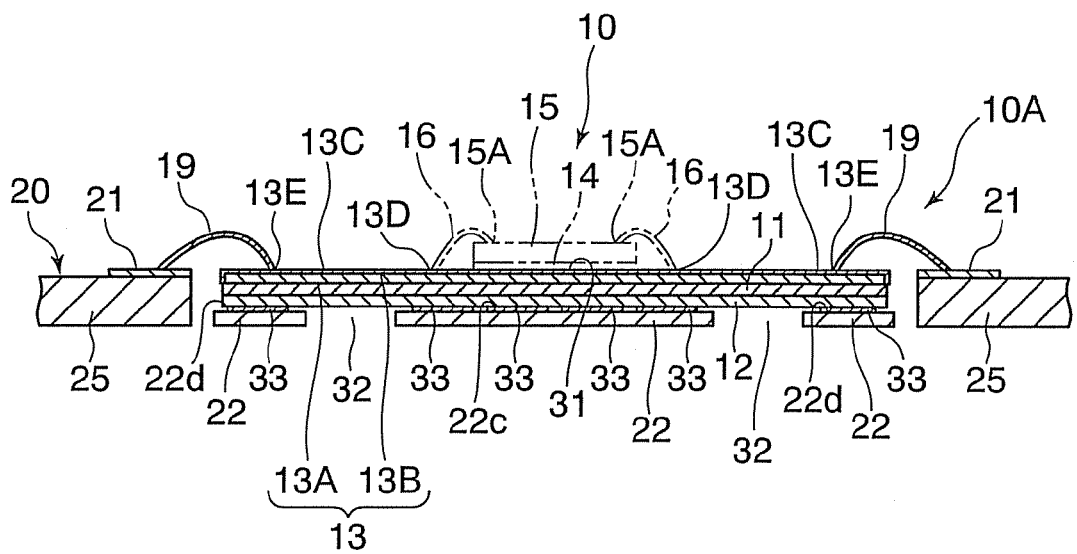
FIG. 27 is a cross-sectional view of a semiconductor composite wiring assembly according to Embodiment 5 of the invention.
Figure 28:
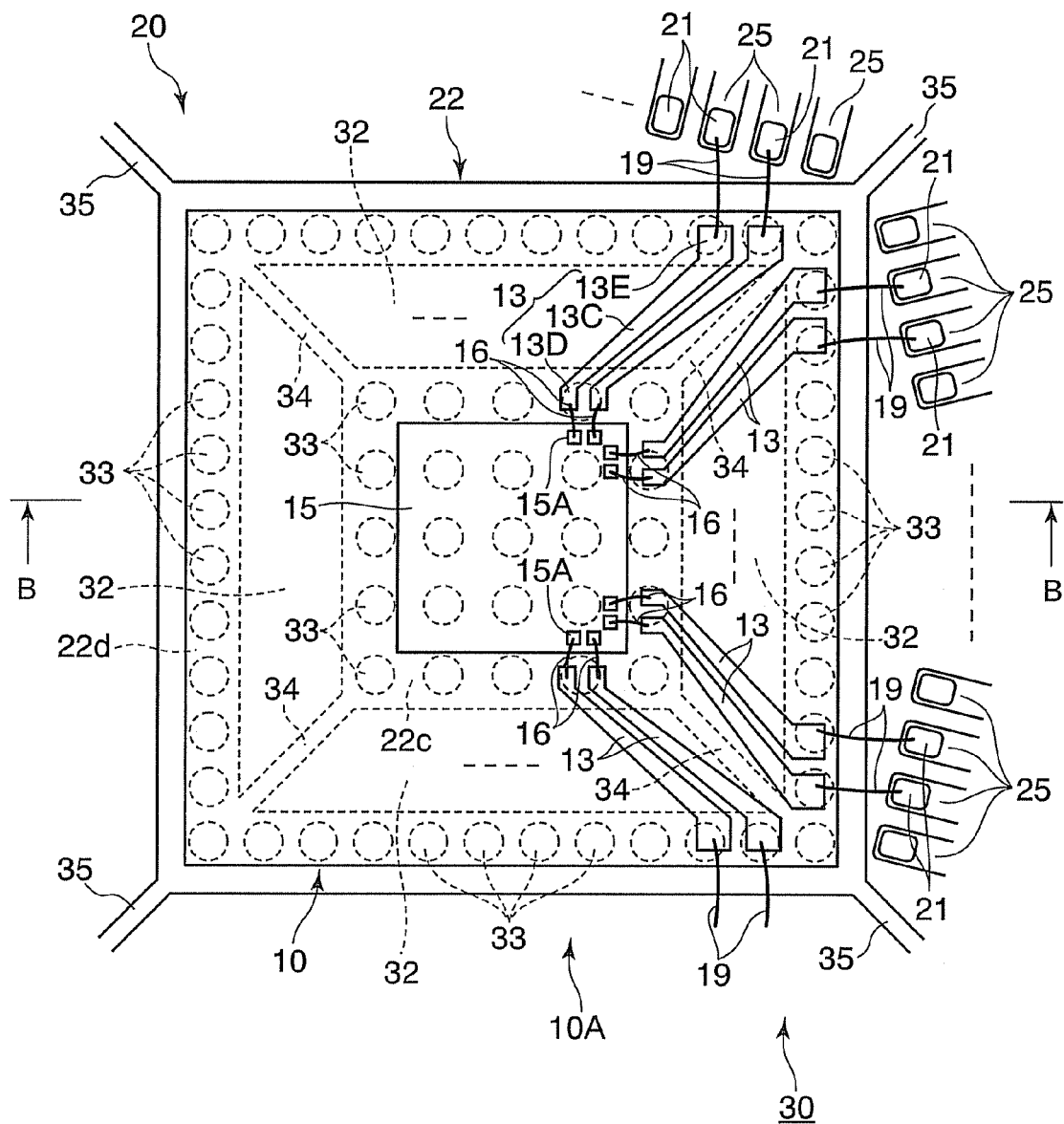
FIG. 28 is a plan view of a semiconductor device having the composite wiring assembly of FIG. 27.

With reference now to FIGS. 27 and 28, a semiconductor composite wiring assembly according to Embodiment 5 is described. The dashed double-dotted lines of FIG. 27 represent components other than those of the semiconductor composite wiring assembly.

The semiconductor composite wiring assembly 10A of FIG. 27 includes the semiconductor wiring assembly 10 of FIG. 26; the lead frame 20 electrically connected to the semiconductor wiring assembly 10; and the second connecting members 19 that electrically connect the second terminals 13E of the copper wiring layer 13 to the lead frame 20. The semiconductor composite wiring assembly 10A is used to electrically connect the electrodes 15A of the semiconductor chip 15 to an external wiring board (not illustrated).

The lead frame 20 includes the die pad 22 on which to place the semiconductor wiring assembly 10; and the lead sections 25 located at outer positions with respect to the die pad 22 (i.e., located around the die pad 22). The inner leads 21 (external wiring) formed by silver plating or palladium plating are provided on the lead sections 25.

The die pad 22 includes a central area 22c and a peripheral area 22d. The central area 22c is the area in which to place the semiconductor chip 15. The peripheral area 22d is located around the central area 22c with spaces formed therebetween. Those spaces serve as resin-seal inflow spaces 32.

As illustrated in the plan view of FIG. 28, the corners of the central area 22c are connected to the corners of the peripheral area 22d by four hanging leads 34. The corners of the peripheral area 22d are also connected to the lead frame 20 by four hanging leads 35. The resin-seal inflow spaces 32 formed between the central area 22c and the peripheral area 22d are intended to tightly seal the lead frame 20 with the resin seal 23 by the resin seal 23 flowing into the resin-seal inflow spaces 32 and being solidified, as will be discussed later in more detail.

As can be seen in FIG. 27, the semiconductor wiring assembly 10 is positioned over the central area 22c and the peripheral area 22d of the die pad 22 so as to cover them. Specifically, the semiconductor wiring assembly 10 is positioned in such a way as to cover the entire top surface of the central area 22c, the entire areas of the resin-seal inflow spaces 32, and part of the peripheral area 22d.

The semiconductor wiring assembly 10 is glued to the central area 22c and the peripheral area 22d of the die pad 22 by resin paste 33. As illustrated in FIG. 28, the resin paste 33 is applied onto the central area 22c and the peripheral area 22d in the form of dots. The resin paste 33 can also be applied onto those areas in the form of lines. Preferred materials for the resin paste 33 include epoxy resin, acrylic resin, and polyimide-based resin.

Among the components of the die pad 22, at least the central area 22c and the peripheral area 22d are preferably plated in advance. By plating the die pad 22, subtle irregularities are formed on the top surface of the die pad 22. Those irregularities help prevent an overflow of the resin paste 33 when it is applied. Flat-rolled copper, which is preferably used as the material of the die pad 22, often has grooves in a certain direction. When such a material is used for the die pad 22, the resin paste 33 may overflow along the grooves. Thus, by plating the top surface of the die pad 22, the grooves can be covered, and an overflow of the resin paste 33 can be prevented. Such plating is preferably performed using Ag, Pd, Au, or the like. While any commonly used material can be used for the plating, Ag is the most desirable in terms of costs.

As illustrated in FIG. 27, the die pad 22 is thinner than the lead sections 25. This allows reduction in the thickness of the semiconductor device 30 on which the semiconductor chip 15 is mounted.

The second connecting members 19 are gold bonding wires. One end of each of the second connecting members 19 is connected to one of the second terminals 13E, and the other end of each of the second connecting members 19 is connected to one of the inner leads 21 of the lead frame 20.

Figure 29:
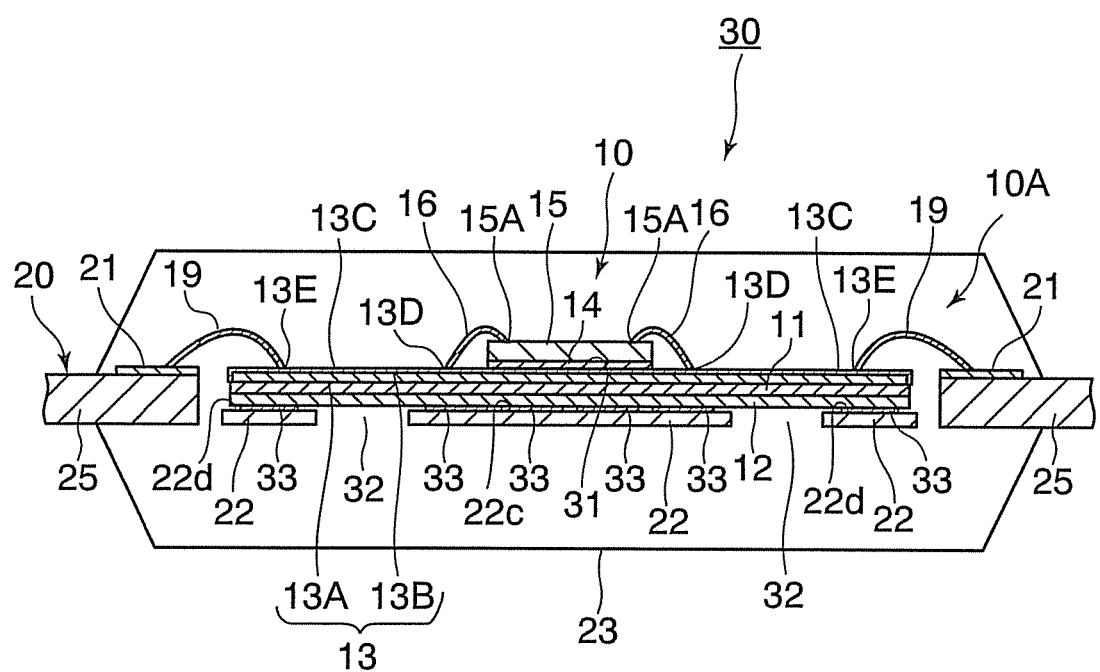
FIG. 29 is a cross-section taken along line B-B of FIG. 28, illustrating the semiconductor device of FIG. 28.
Figure 30:
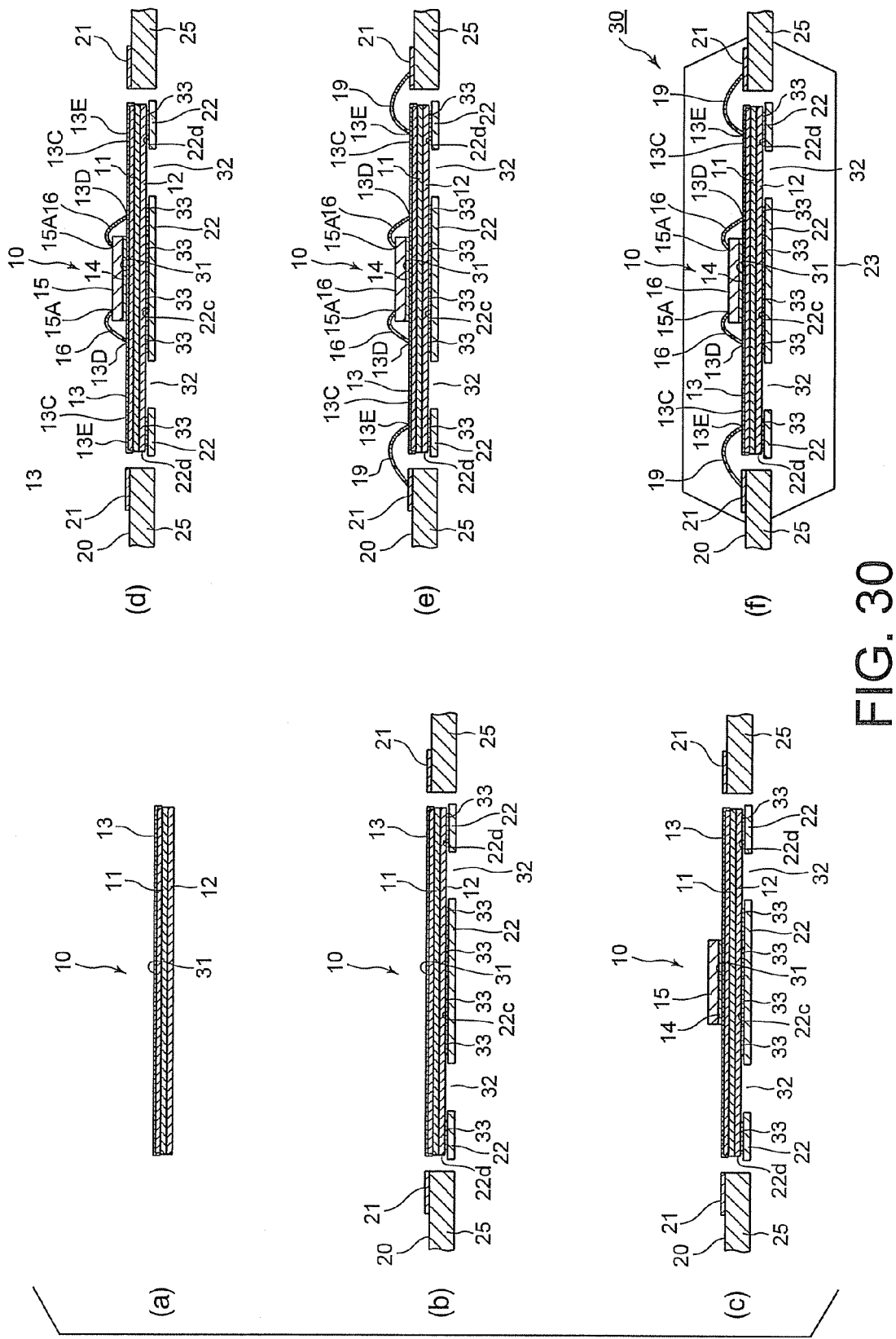
FIGS. 30(a) to 30(f) illustrate a method for manufacturing the semiconductor device of FIG. 28.

With reference next to FIGS. 28 and 29, a semiconductor device having the semiconductor composite wiring assembly 10A of FIG. 27 is described. In FIG. 28, the resin seal 23 is not illustrated for a simplification purpose.

The semiconductor device 30 of FIGS. 28 and 29 includes the lead frame 20 having the die pad 22; and the semiconductor wiring assembly 10 of FIG. 26 mounted on the die pad 22 of the lead frame 20 and electrically connected to the lead frame 20. The semiconductor chip 15 having the electrodes 15A is placed on the chip placement section 31 of the semiconductor wiring assembly 10. The semiconductor chip 15 is glued to the chip placement section 31 via the adhesive layer 14.

The inner leads 21, which have conducting properties, are formed on the top surface of the lead frame 20, and the second connecting members 19 (i.e., gold (Au) bonding wires) each electrically connect one of the second terminals 13E of the copper wiring layer 13 to one of the inner leads 21. Each of the first connecting members 16 (i.e., gold (Au) bonding wires) electrically connects one of the electrodes 15A of the semiconductor chip 15 to one of the first terminals 13D. The semiconductor chip 15, the copper wiring layer 13, the lead frame 20, the first connecting members 16, and the second connecting members 19 are all sealed by the resin seal 23 with the lead sections 25 of the lead frame 20 partially exposed.

The die pad 22 includes the central area 22c and the peripheral area 22d. The central area 22c is the area in which to place the semiconductor chip 15. The peripheral area 22d is located around and connected to the central area 22c with the resin-seal inflow spaces 32 formed there between.

Since the die pad 22 has already been described with reference to FIGS. 27 and 28, and its structure is not discussed further in detail.

As can be seen in FIG. 29, the semiconductor wiring assembly 10 is positioned over the central area 22c and the peripheral area 22d of the die pad 22 so as to cover them. The semiconductor wiring assembly 10 is glued to the central area 22c and the peripheral area 22d of the die pad 22 by the resin paste 33, as described in detail with reference to FIGS. 27 and 28.

With reference now to FIGS. 20(a) through 20(d) and 30(a) through 30(f), a possible method is described for manufacturing the semiconductor device of FIGS. 28 and 29, together with advantages resulting from Embodiment 5.

First, the steps of FIGS. 20(a) to 20(d) are followed to manufacture the semiconductor wiring assembly 10 of FIG. 26 (FIG. 30(a)).

Next, the lead frame 20 having the lead sections 25 and the die pad 22 is provided, and the semiconductor wiring assembly 10 is glued to the die pad 22 (FIG. 30(b)). Among the components of the die pad 22, at least the central area 22c and the peripheral area 22d are preferably plated in advance. During the step of FIG. 30(b), the resin paste 33 is used to glue the semiconductor wiring assembly 10 to the central area 22c and the peripheral area 22d of the die pad 22.

Specifically, the resin paste 33 is applied onto the central area 22c and the peripheral area 22d in the form of dots. In that case, a syringe may be used to apply the resin paste 33 drop by drop, or multiple drops can be applied at a time. The resin paste 33 can also be applied in the form of lines. To form lines of the resin paste 33, the syringe may be moved linearly.

The semiconductor wiring assembly 10 is then positioned over the central area 22c and the peripheral area 22d of the die pad 22. Thereafter, the lead frame 20 on which the semiconductor wiring assembly 10 has been mounted is heated, thereby solidifying the applied resin paste 33 and fixing the semiconductor wiring assembly 10 to the die pad 22.

The semiconductor chip 15 is then glued to the chip placement section 31 of the semiconductor wiring assembly 10 via the adhesive layer 14 (FIG. 30(c)). Next, the first connecting members 16 (i.e., bonding wires) are used to connect the electrodes 15A of the semiconductor chip 15 to the first terminals 13D of the copper wiring layer 13 (FIG. 30(d)).

Next, the second connecting members 19 (i.e., bonding wires) are used to connect the second terminals 13E of the copper wiring layer 13 to the inner leads 21 of the lead frame 20 (FIG. 30(e)).

Thereafter, the semiconductor wiring assembly 10, the semiconductor chip 15, the first connecting members 16, the die pad 22, the second connecting members 19, and the inner leads 21 are all sealed by the resin seal 23 with part of the lead frame (i.e., outer leads) exposed, thereby completing the semiconductor device 30 of FIG. 29 (FIG. 30(f)). During the resin sealing, the resin seal 23 flows into the resin-seal inflow spaces 32 formed between the central area 22c and the peripheral area 22d. Thus, the lead frame 20 is tightly sealed with the resin seal 23 after the resin seal 23 is solidified.

The semiconductor wiring assembly 10 and the die pad 22 are heated at a temperature of 180 degrees Celsius or thereabout during the mounting of the wiring assembly 10 on the die pad 22, during the curing or baking of the semiconductor chip 15 that follows, and during the sealing with the resin seal 23. In those cases, the adhesive that glues the semiconductor wiring assembly 10 and the die pad 22 is also heated. Thus, if the adhesive contains any moisture, vapor is likely to occur by that moisture being heated. In Embodiment 5, therefore, the resin paste 33 is used to glue the semiconductor wiring assembly 10 and the die pad 22. Generally, resin paste is less likely to generate organic gas and less moisture-absorptive. Therefore, gas (organic gas and vapor) is less likely to be generated from the resin paste 33, and there is less chance of gas remaining in the resin seal 23.

If, on the other hand, the resin seal 23 is solidified with gas trapped near the boundary between the die pad 22 and the semiconductor wiring assembly 10 and a reflow test is conducted thereafter, the gas-trapped portion may swell, resulting in a crack in the semiconductor device 30. In Embodiment 5, by contrast, the resin paste 33 reduces the chance of gas remaining in the resin seal 23. Thus, there is no chance of cracks being generated in the semiconductor device 30 during reflow tests.

As stated above, the lead frame 20 can be tightly sealed with the resin seal 23 since the resin-seal inflow spaces 32 are formed between the central area 22c and the peripheral area 22d of the die pad 22. This also helps prevent cracks from being generated during a reflow test because there is no chance of clearances being formed between the bottom surface of the die pad 22 and the resin seal 23.

Embodiment 5 allows a smaller semiconductor chip than conventional ones to be connected to the lead frame 20. The pitch of the inner leads 21 of the lead frame 20 is relatively large (e.g., 130 μm) and the pitch of the electrodes 15A of semiconductor chip 15 is relatively small (e.g., 40 μm). Even in that case, the connection between the semiconductor chip 15 and the inner leads 21 of the lead frame 20 is ensured.

In addition, the semiconductor device 30 of Embodiment 5 is thinner since the central area 22c and the peripheral area 22d of the die pad 22 are made thinner than the lead sections 25.

Moreover, Embodiment 5 can prevent cracks from being generated in the semiconductor device 30 during a reflow test because, as stated above, the resin paste 33 is used to glue the semiconductor wiring assembly 10 to the central area 22c and the peripheral area 22d of the die pad 22 and because the resin-seal inflow spaces 32 are formed between the central area 22c and the peripheral area 22d.

Also, in Embodiment 5, the resin paste 33 is applied in the form of dots or lines. Thus, the resin paste 33 can be uniformly applied onto the central area 22c and the peripheral area 22d.

Further, since the copper wiring layer 13 is present between the first connecting members 16 and the second connecting members 19, Embodiment 5 also allows reduction in the manufacturing cost of the semiconductor device 30, which would be lower than when gold bonding wires are used to directly connect the electrodes 15A of the semiconductor chip 15 to the inner leads 21 of the lead frame 20.

Furthermore, since the metal substrate 12 of Embodiment 5 is made of stainless steel, it is more rigid and thinner and can be handled more easily than conventional polyimide substrates.

What is claimed is:

1. A semiconductor composite wiring assembly for electrically connecting electrodes of a semiconductor chip to a wiring board, the semiconductor composite wiring assembly comprising:
   a wiring assembly; and
   a lead frame electrically connected to the wiring assembly with the wiring assembly mounted thereon,
   wherein the wiring assembly includes:
   an insulating layer;
   a metal substrate formed on one surface of the insulating layer; and
   a copper wiring layer formed on the opposite surface of the insulating layer, the copper wiring layer having thereon a chip placement section, the copper wiring layer further having:
      first terminals each being connected electrically to one of the electrodes of the semiconductor chip;
      second terminals each connected electrically to the lead frame by a second connecting member; and
      wiring sections each adapted to connect one of the first terminals and one of the second terminals,
   wherein the lead frame includes:
   a die pad for mounting thereon the wiring assembly, the die pad having:
      a central area in which the semiconductor chip is mounted via the wiring assembly; and
      a peripheral area connected to and located around the central area with spaces formed therebetween, the spaces serving as spaces into which a resin seal flows; and
   lead sections located at outer positions with respect to the die pad,
   wherein the insulating layer, the metal substrate and the copper wiring layer of the wiring assembly are positioned over the central area and the peripheral area so as to cover the central area completely and the peripheral area at least partially beyond the extent of the spaces, and
   wherein at least the central area and the peripheral area of the die pad are glued to the metal substrate of the wiring assembly by resin paste.

2. The semiconductor composite wiring assembly of claim 1, wherein the metal substrate is made of stainless steel.

3. The semiconductor composite wiring assembly of claim 1, wherein the resin paste is applied onto the central area and the peripheral area in the form of dots or lines.

4. The semiconductor composite wiring assembly of claim 1, wherein at least the central area and the peripheral area of the die pad are plated.

5. A resin-sealed semiconductor device comprising:
   a wiring assembly;
   a lead frame electrically connected to the wiring assembly with the wiring assembly mounted thereon; and
   a semiconductor chip having electrodes,
   wherein the wiring assembly includes:
   an insulating layer;
   a metal substrate formed on one surface of the insulating layer; and
   a copper wiring layer formed on the opposite surface of the insulating layer, the copper wiring layer having thereon a chip placement section, the copper wiring layer further having:
      first terminals each connected electrically to one of the electrodes of the semiconductor chip by a first connecting member;
      second terminals each connected electrically to the lead frame by a second connecting member; and
      wiring sections each adapted to connect one of the first terminals and one of the second terminals,
   wherein the lead frame includes:
   a die pad for mounting thereon the wiring assembly, the die pad having:
      a central area in which the semiconductor chip is mounted via the wiring assembly; and
      a peripheral area connected to and located around the central area with spaces formed therebetween, the spaces serving as spaces into which a resin seal flows; and
   lead sections located at outer positions with respect to the die pad,
   wherein the semiconductor chip is mounted on the chip placement section,
   wherein the insulating layer, the metal substrate and the copper wiring layer of the wiring assembly are positioned over the central area and the peripheral area so as to cover the central area completely and the peripheral area at least partially beyond the extent of the spaces,
   wherein at least the central area and the peripheral area of the die pad are glued to the metal substrate of the wiring assembly by resin paste, and
   wherein the semiconductor chip, the copper wiring layer, the lead frame, the first connecting members, and the second connecting members are all sealed with a resin seal with the lead frame exposed partially.

6. The semiconductor device of claim 5, wherein the metal substrate is made of stainless steel.

7. The semiconductor device of claim 5, wherein the resin paste is applied onto the central area and the peripheral area in the form of dots or lines.

8. The semiconductor device of claim 5, wherein at least the central area and the peripheral area of the die pad are plated.

* * * * *